US009606907B2

(12) United States Patent
Lee et al.

(10) Patent No.: US 9,606,907 B2
(45) Date of Patent: *Mar. 28, 2017

(54) MEMORY MODULE WITH DISTRIBUTED DATA BUFFERS AND METHOD OF OPERATION

(71) Applicant: Netlist, Inc., Irvine, CA (US)

(72) Inventors: Hyun Lee, Ladera Ranch, CA (US); Jayesh R. Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 354 days.

This patent is subject to a terminal disclaimer.

(21) Appl. No.: 13/970,606

(22) Filed: Aug. 20, 2013

(65) Prior Publication Data

US 2014/0040568 A1     Feb. 6, 2014

Related U.S. Application Data

(63) Continuation of application No. 12/761,179, filed on Apr. 15, 2010, now Pat. No. 8,516,185, which is a
(Continued)

(51) Int. Cl.
*G06F 12/00* (2006.01)
*G11C 5/02* (2006.01)
(Continued)

(52) U.S. Cl.
CPC ............. *G06F 12/00* (2013.01); *G11C 5/025* (2013.01); *G11C 5/04* (2013.01); *G11C 5/066* (2013.01); *G11C 8/12* (2013.01)

(58) Field of Classification Search
None
See application file for complete search history.

(56) References Cited

U.S. PATENT DOCUMENTS

| 4,249,253 A | 2/1981 | Gentili et al. |
| 4,571,676 A | 2/1986 | Mantellina et al. |

(Continued)

FOREIGN PATENT DOCUMENTS

| JP | 09237492 | 9/1997 |
| JP | H10092169 A | 9/1997 |

(Continued)

OTHER PUBLICATIONS

Anonymous. (Dec. 1996). "Applications Note: Understanding DRAM Operation," IBM, 10 pages.

(Continued)

*Primary Examiner* — Edward Dudek, Jr.
*Assistant Examiner* — Ralph A Verderamo, III
(74) *Attorney, Agent, or Firm* — Jamie J. Zheng, Esq.

(57) ABSTRACT

A memory module is operable to communicate with a memory controller via a data bus and a control/address bus and comprises a module board; a plurality of memory devices mounted on the module board; and multiple sets of data pins along an edge of the module board. Each respective set of the multiple sets of data pins is operatively coupled to a respective set of multiple sets of data lines in the data bus. The memory module further comprises a control circuit configured to receive control/address information from the memory controller via the control/address bus and to produce module control signals. The memory module further comprises a plurality of buffer circuits each being disposed proximate to and electrically coupled to a respective set of the multiple sets of data pins. Each buffer circuit is configured to respond to the module control signals by enabling data communication between the memory controller and at least one first memory device among the plurality of memory devices and by isolating at least one
(Continued)

second memory device among the plurality of memory devices from the memory controller.

65 Claims, 13 Drawing Sheets

Related U.S. Application Data continuation-in-part of application No. 12/504,131, filed on Jul. 16, 2009, now Pat. No. 8,417,870.

(51) Int. Cl.
*G11C 5/04* (2006.01)
*G11C 5/06* (2006.01)
*G11C 8/12* (2006.01)

(56) References Cited

U.S. PATENT DOCUMENTS

| | | | |
|---|---|---|---|
| 4,592,011 A | 5/1986 | Mantellina et al. |
| 4,739,473 A | 4/1988 | Ng |
| 5,060,188 A | 10/1991 | Zulian et al. |
| 5,313,624 A | 5/1994 | Harriman |
| 5,345,412 A | 9/1994 | Shiratsuchi |
| 5,463,590 A | 10/1995 | Watanabe |
| 5,513,135 A | 4/1996 | Dell et al. |
| 5,532,954 A | 7/1996 | Bechtolsheim et al. |
| 5,537,584 A | 7/1996 | Miyai et al. |
| 5,541,448 A | 7/1996 | Carpenter |
| 5,572,691 A | 11/1996 | Koudmani |
| 5,617,559 A | 4/1997 | Le et al. |
| 5,630,096 A | 5/1997 | Zuravleff |
| 5,649,159 A | 7/1997 | Le et al. |
| 5,655,113 A | 8/1997 | Leung |
| 5,717,851 A | 2/1998 | Yishay et al. |
| 5,724,604 A | 3/1998 | Moyer |
| 5,729,716 A | 3/1998 | Lee et al. |
| 5,784,705 A | 7/1998 | Leung |
| 5,802,541 A | 9/1998 | Reed |
| 5,905,401 A | 5/1999 | Sher |
| RE36,229 E | 6/1999 | Cady |
| 5,953,280 A | 9/1999 | Matsui |
| 5,973,392 A | 10/1999 | Senba et al. |
| 6,011,710 A | 1/2000 | Wiggers |
| 6,061,754 A | 5/2000 | Cepulis |
| 6,141,245 A | 10/2000 | Bertin |
| 6,173,357 B1 | 1/2001 | Ju |
| 6,188,641 B1 | 2/2001 | Uchida |
| 6,205,516 B1 | 3/2001 | Usami |
| 6,260,127 B1 | 7/2001 | Olarig et al. |
| 6,262,938 B1 | 7/2001 | Lee |
| 6,438,062 B1 | 8/2002 | Curtis |
| 6,446,158 B1 | 9/2002 | Karabatsos |
| 6,480,439 B2 | 11/2002 | Tokutome et al. |
| 6,546,476 B1 | 4/2003 | Gillingham |
| 6,553,449 B1 | 4/2003 | Dodd et al. |
| 6,618,791 B1 | 9/2003 | Dodd et al. |
| 6,636,446 B2 | 10/2003 | Lee |
| 6,704,910 B2 | 3/2004 | Hong |
| 6,717,855 B2 | 4/2004 | Underwood |
| 6,747,887 B2 | 6/2004 | Halbert et al. |
| 6,788,592 B2 | 9/2004 | Nakata et al. |
| 6,832,303 B2 | 12/2004 | Tanaka |
| 6,948,084 B1 | 9/2005 | Manapat et al. |
| 7,024,518 B2 | 4/2006 | Halbert et al. |
| 7,093,066 B2 | 8/2006 | Klein |
| 7,130,308 B2 | 10/2006 | Haddock et al. |
| 7,133,960 B1 | 11/2006 | Thompson et al. |
| 7,191,302 B2 | 3/2007 | Usami |
| 7,225,303 B2 | 5/2007 | Choi |
| 7,379,361 B2 | 5/2008 | Co et al. |
| 7,464,225 B2 | 12/2008 | Tsern |
| 7,730,254 B2 | 6/2010 | Risse |
| 7,865,674 B2 * | 1/2011 | Gower .............. G06F 13/1684 365/189.02 |
| 7,881,150 B2 | 2/2011 | Solomon et al. |
| 7,916,574 B1 | 3/2011 | Solomon et al. |
| 7,990,746 B2 | 8/2011 | Rajan |
| 8,001,434 B1 | 8/2011 | Lee et al. |
| 8,089,795 B2 | 1/2012 | Rajan |
| 8,189,328 B2 | 5/2012 | Kanapathippillai |
| 8,233,303 B2 | 7/2012 | Best |
| 8,244,971 B2 | 8/2012 | Rajan |
| 8,250,295 B2 | 8/2012 | Amidi et al. |
| 8,335,894 B1 | 12/2012 | Rajan |
| 8,516,188 B1 | 8/2013 | Solomon et al. |
| 8,689,064 B1 | 4/2014 | Lee et al. |
| 8,782,350 B2 | 7/2014 | Lee et al. |
| 8,856,464 B2 | 10/2014 | Karamcheti |
| 2001/0008006 A1 | 7/2001 | Klein |
| 2002/0038405 A1 | 3/2002 | Leddige et al. |
| 2002/0048195 A1 | 4/2002 | Klein |
| 2003/0070052 A1 | 4/2003 | Lai |
| 2004/0098528 A1 | 5/2004 | Janzen |
| 2005/0010737 A1 | 1/2005 | Ware et al. |
| 2005/0257109 A1 | 11/2005 | Averbuj |
| 2006/0262586 A1 | 11/2006 | Solomon et al. |
| 2007/0070669 A1 | 3/2007 | Tsern |
| 2007/0293094 A1 | 12/2007 | Aekins |
| 2008/0046631 A1 | 2/2008 | Takaku et al. |
| 2008/0104352 A1 | 5/2008 | Talbot |
| 2008/0162790 A1 | 7/2008 | Im |
| 2009/0103387 A1 | 4/2009 | Shau |
| 2009/0248969 A1* | 10/2009 | Wu ...................... G06F 13/1684 711/105 |
| 2009/0296503 A1 | 12/2009 | Chu et al. |
| 2010/0070690 A1 | 3/2010 | Amer et al. |
| 2010/0091540 A1 | 4/2010 | Bhakta et al. |
| 2010/0125681 A1* | 5/2010 | Patel ...................... G06F 1/3203 710/14 |
| 2011/0085408 A1 | 4/2011 | Neubauer |
| 2011/0090749 A1 | 4/2011 | Bhakta et al. |
| 2011/0125966 A1 | 5/2011 | Amidi et al. |

FOREIGN PATENT DOCUMENTS

| | | |
|---|---|---|
| JP | 2010320270 | 12/1998 |
| JP | 2000285674 | 10/2000 |
| JP | 2000311485 A | 10/2000 |
| JP | 2002184176 | 6/2002 |
| JP | 2003007963 | 1/2003 |
| JP | 2008046989 | 2/2008 |

OTHER PUBLICATIONS

Behrens, S. "HP Printer Memory Explained", The ZonkPage, Last Updated Jan. 21, 2004. Accessed Feb. 10, 2013, Retrieved from the Internet: URL <http://warshaft.com/hpmem.htm>. 7pp.
Non-Final Office Action, U.S. Appl. No. 13/412,243, Jan. 2, 2014, 20 pages.
Non-final office action, U.S. Appl. No. 13/288,850, Oct. 11, 2013, 24 pages.
Non-final office action, U.S. Appl. No. 13/411,344, Dec. 31, 2013, 28 pages.
Non-final office action, U.S. Appl. No. 13/473,413, Nov. 17, 2011, 46 pages.
Response to non-final office action dated Oct. 14, 2013 for U.S. Appl. No. 13/288,850, filed Jan. 13, 2014, 15 pages.
Response to non-final office action dated Dec. 31, 2013 for U.S. Appl. No. 13/411,344, filed Mar. 31, 2014, 12 pages.
Patent Owner's Response to Office Action mailed Nov. 13, 2012 for Reexamination Control Nos. 95/000,578; 95/000,579, and 95/001,339, filed Jan. 14, 2013, 96 pages.
Patent Owner's Response to Office Action mailed Dec. 19, 2012 for Reexamination Control No. 95/001,758, filed Mar. 19, 2013, 61 pages.
Patent Owner's Response to Office Action mailed Sep. 26, 2013 for Reexamination Control No. 95/001,758, filed Nov. 26, 2013, 85 pages.
Third Party Requester's Comments after Non-Final Action mailed Sep. 26, 2013 for Reexamination Control No. 95/001,758, filed Dec. 26, 2013.

(56) References Cited

OTHER PUBLICATIONS

Patent Owner's Appeal Brief for Reexamination Control Nos. 95/000,546 and 95/000,577, filed Oct. 2, 2013, 46 pages.
Patent Trial and Appeal Board Decision on Appeal for Reexamination Control No. 95/001,337, mailed Jan. 16, 2014, 30 pages.
Patent Trial and Appeal Board Decision on Appeal for Reexamination Control No. 95/001,381, mailed Jan. 16, 2014, 24 pages.
Action Closing Prosecution mailed Mar. 27, 2014 for Reexamination Control No. 95/001,758, filed Sep. 14, 2011, 40 pages.
Action Closing Prosecution mailed Mar. 27, 2014 for Reexamination Control No. 95/001,339, filed Jun. 8, 2010, 106 pages.
Notice of Allowance, U.S. Appl. No. 12/504,131, Feb. 12, 2013, 52 pages.
Non-Final Office Action, dated Jan. 2, 2014, for U.S. Appl. No. 13/287,042, filed Nov. 1, 2011, 42 pages.
Response to Non-Final Office Action dated Jan. 2, 2014, filed Apr. 2, 2004, for U.S. Appl. No. 13/287,042, filed Nov. 1, 2011, 12 pages.
Office Action mailed Apr. 2, 2014, for Japanese Patent Application No. 2012-520662 and English translation thereof, 7 pages.
Inter Partes Review of U.S. Pat. No. 7,881,150, IPR Case No. IPR2014-00882, Patent Owner's Preliminary Response Pursuant to 37 C.F.R. § 42.107, filed Oct. 7, 2014.
Inter Partes Review of U.S. Pat. No. 7,881,150, IPR Case No. IPR2014-00882, Decision—Institution of Inter Partes Review 37 C.F.R. § 42.108, issued Dec. 16, 2014.
Inter Partes Review of U.S. Pat. No. 8,081,536, IPR Case No. IPR2014-00883, Patent Owner's Preliminary Response Pursuant to 37 C.F.R. § 42.107, filed Oct. 7, 2014.
Inter Partes Review of U.S. Pat. No. 8,081,536, IPR Case No. IPR2014-00883, Decision—Institution of Inter Partes Review 37 C.F.R. § 42.108, issued Dec. 16, 2014.
Inter Partes Review of U.S. Pat. No. 7,881,150, IPR Case No. IPR2014-01011, Patent Owner's Preliminary Response Pursuant to 37 C.F.R. § 42.107, filed Oct. 7, 2014.
Inter Partes Review of U.S. Pat. No. 7,881,150, IPR Case No. IPR2014-01011, Decision—Institution of Inter Partes Review 37 C.F.R. § 42.108, issued Dec. 16, 2014.
Inter Partes Review of U.S. Pat. No. 7,881,150, IPR Case No. IPR2014-01011, Exhibit 3001 to Decision—Institution of Inter Partes Review, Excerpts from IEEE Dictionary, issued Dec. 16, 2014.
Inter Partes Review of U.S. Pat. No. 7,881,150, IPR Case No. IPR2014-01011, Exhibit 3002 to Decision—Institution of Inter Partes Review, Excerpts from IEEE Dictionary, issued Dec. 16, 2014.
Inter Partes Review of U.S. Pat. No. 7,881,150, IPR Case No. IPR2014-01011, Exhibit 3003 to Decision—Institution of Inter Partes Review, Excerpts from Oxford English Dictionary, issued Dec. 16, 2014.
Inter Partes Review of U.S. Pat. No. 7,881,150, IPR Case No. IPR2014-01011, Exhibit 3004 to Decision—Institution of Inter Partes Review, Excerpts from Oxford English Dictionary, issued Dec. 16, 2014.
Petition for Inter Partes Review filed on Jun. 24, 2014 for U.S. Pat. No. 8,516,185, IPR Case No. IPR2014-01029, and all associated documents including cited references and expert declarations, available at https://ptabtrials.uspto.gov.
Petition for Inter Partes Review filed on Jun. 22, 2014 for U.S. Pat. No. 7,881,150, IPR Case No. IPR2014-00882 and IPR Case No. IPR2014-01011, and all associated documents including cited references and expert declarations, available at https://ptabtrials.uspto.gov.
Petition for Inter Partes Review filed on Jun. 24, 2014 for U.S. Pat. No. 8,081,536, IPR Case No. IPR2014-00883, and all associated documents including cited references and expert declarations, available at https://ptabtrials.uspto.gov.
Altera, ACEX iK, Programmable Logic Device Family, Data Sheet, May 2003, Ver 3.4.
Horowitz, "The Art of Electronics," Cambridge Univ. Press, 1989, selected pages.
Huang et al, "An Efficient Parallel Transparent BIST Method for Multiple Embedded Memory Buffers," VLSI Design 2011, p. 379.
Jacob, Bruce L.; "Synchronous DDRAM Architectures, Organizations, and Alternative Technologies". University of Maryland, Dec. 10, 2002.
JEDEC Standard No. 21-C Section 4.5.7, 168 Pin Registered SDRAM DIMM Family, Release 7.
JEDEC 21-C, Section 4..6.1, 278 Pin Buffered SDRAM DIMM Family.
JEDEC Standard No. 21-C Section 4.1.2.5, Appendix E, "Specific Pd's for Synchronous DRAM (SDRAM)," pp. 1-25.
JEDEC Standard, "Fully Buffered DIMM (FBDIMM): DFx Design for Validation and Test," JESD82-28, Feb. 2008.
Reese, "Introduction to Logic Synthesis using Verilog HDL," Morgan&Claypool Publishers, 2006, pp. 1-28.
Reexam Appl. No. 95/000,546 for U.S. Pat. No. 7,289,386, May 11, 2010, Netlist, Inc.
Reexam Appl. No. 95/000,577 for U.S. Pat. No. 7,289,386, Oct. 20, 2010, Netlist, Inc.
Reexam Appl. No. 95/000,578 for U.S. Pat. No. 7,619,912, Oct. 20, 2010, Netlist, Inc.
Reexam Appl. No. 95/000,579 for U.S. Pat. No. 7,619,912, Oct. 21, 2010, Netlist, Inc.
Reexam App. No. 95/001,337 for U.S. Pat. No. 7,636,274, Jun. 4, 2010, Netlist, Inc.
Reexam Appl. No. 95/001,381 for U.S. Pat. No. 7,532,537, Jun. 9, 2010, Netlist, Inc.
Reexam Appl. No. 95/001,338; for U.S. Pat. No. 7,532,537, Apr. 19, 2010, Netlist, Inc.
Reexam Appl. No. 95/001,758 for U.S. Pat. No. 7,864,627, Sep. 15, 2011, Netlist, Inc.
Reexam Appl. No. 95/001,339 for U.S. Pat. No. 7,619,912, Jun. 8, 2010, Netlist, Inc.
Reexam Appl. No. 95/002,399 for U.S. Pat. No. 8,250,295, Sep. 15, 2010, Smart Modular Technologies, Inc.
U.S. Appl. No. 11/075,395, filed Mar. 7, 2005, Netlist, Inc.
U.S. Appl. No. 11/173,175, filed Jul. 1, 2005, Netlist, Inc.
U.S. Appl. No. 11/862,931, filed Sep. 27, 2007, Netlist, Inc.
U.S. Appl. No. 12/577,682, filed Oct. 12, 2009, Netlist, Inc.
U.S. Appl. No. 12/954,492, filed Nov. 24, 2010, Netlist, Inc.
U.S. Appl. No. 12/912,623, filed Oct. 26, 2010, Netlist, Inc.
U.S. Appl. No. 11/335,875, filed Jan. 19, 2006, Netlist, Inc.
U.S. Appl. No. 12/408,652, filed Mar. 20, 2009, Netlist, Inc.
U.S. Appl. No. 12/629,827, filed Dec. 2, 2009, Netlist, Inc.
U.S. Appl. No. 12/955,711, filed Nov. 29, 2010, Netlist, Inc.
U.S. Appl. No. 12/981,380, filed Dec. 29, 2010, Netlist, Inc.
U.S. Appl. No. 13/154,172, filed Jun. 6, 2011, Netlist, Inc.
U.S. Appl. No. 13/287,042, filed Nov. 1, 2011, Netlist, Inc.
U.S. Appl. No. 13/473,413, filed May 16, 2012, Netlist, Inc.
U.S. Appl. No. 13/032,470, filed Feb. 22, 2011, Netlist, Inc.
U.S. Appl. No. 13/287,081, filed Nov. 1, 2011, Netlist, Inc.
U.S. Appl. No. 13/971,231, filed Aug. 20, 2013, Netlist, Inc.
U.S. Appl. No. 12/422,853, filed Apr. 13, 2009, Netlist, Inc.
U.S. Appl. No. 13/412,243, filed Mar. 5, 2012, Netlist, Inc.
U.S. Appl. No. 12/422,925, filed Apr. 13, 2009, Netlist, Inc.
U.S. Appl. No. 13/183,253, filed Jul. 14, 2011, Netlist, Inc.
Anonymous. (May 2002). "Hynix HYMD512G726(L)8-K/H/L Registered DDR SDRAM DIMM, 128Mx72 bits Product Description," Rev. 0.1/May, 2, pp. 1-16.
"Elipida Memory to Speak at Intel's Memory Implementers Forum Roundtable Event", Intel Developer Forum, [Online]. Retrieved from the Internet: <URSL: http://www.elpida.com/en/news/2004/02-18.html>, (Jun. 14, 2011), 1 pg.
Google, Inc. v. Netlist, Inc., No. 4:08-cv-04144-Sba, Netlist Inc.'s Answer to Complaint and Counterclaim (N.D. Ca. Filed Nov. 18, 2008).
Google, Inc. v. Netlist, Inc., No. C 08-04144 Sba Google Inc.'s Invalidity Contentions Pursuant to Pat. L.F. 3-3, dated Apr. 13, 2009.
Google, Inc. v. Netlist, Inc., No. C08 04144, Complaint for Declaratory Relief, (N.D. Ca Dated Aug. 29, 2008).
Intel[R] 6400/6402 Advanced Memory Buffer Datasheet, published Oct. 2006.

(56) References Cited

OTHER PUBLICATIONS

Letter from G. Hopkins Guy III, Orrick, Herrington & Sutcliffe LLP, to R. Scott Oliver, Morrison & Foerster, (Apr. 14, 2009).
U.S. Appl. No. 13/745,790, filed Jan. 19, 2013, Netlist, Inc.
U.S. Appl. No. 14/229,844, filed Mar. 29, 2014, Netlist, Inc.
U.S. Appl. No. 12/504,131, filed Jul. 16, 2009, Netlist, Inc.
U.S. Appl. No. 12/761,179, filed Apr. 15, 2010, Netlist, Inc.
U.S. Appl. No. 13/288,850, filed Nov. 3, 2011, Netlist, Inc.
U.S. Appl. No. 13/411,344, filed Mar. 2, 2012, Netlist, Inc.
U.S. Appl. No. 13/952,599, filed Jul. 27, 2013, Netlist, Inc.
Luthra et al. "Interface Synthesis Using Memory Mapping for an FPGA Platform," Proceedings of the 21st International Conference on Computer Design, 2003.
*MetaRAM, Inc. v. Netlist, Inc.* No. 3:09-cv-01309-VRW, MetaRam's Reply to Netlist's Counterclaims, (N.D. Ca. Filed Jun. 3, 2009).
*MetaRam, Inc. v. Netlist, Inc.*, No. 3:09-cv-01309-VRW, Netlist's Answer to Complaint and Counterclaims, (N.D. Ca, filed May 11, 2009).
*MetaRAM, Inc. v. Netlist, Inc.*, No. C09 01309, Complaint for Patent Infringement, (N.D. Ca. Filed Mar. 25, 2009).
Micron "DDR2 SDRAM Registered DIMM (RDIMM)," 2003 Micron Technology, Inc. 18 pages.
Micron "Synchronous DRAM Module MT18LSDT472," 1998, Micron Technology, Inc., 17 pages.
Micron Technical Note,"Decoupling Capacitor Calculations for a DDR Memory Channel," 2004, 3 pages.
Miles J. Murdocca et al., "Principles of Computer Architecture", Prentice Hall, Inc., Upper Saddle River, NJ, 2000, pp. 243-252.
Murdocca et al., "Principles of Computer Architecture," Prentice Hall, 2000, pp. 249-251.
*Netlist, Inc. v. MetaRam, Inc.*, No. 09-165-GMS, MetaRAM, Inc.'s Answer and Affirmative Defenses to Plaintiffs Complaint, dated Apr. 20, 2009.
*Netlist, Inc. v. MetaRAM, Inc.*, No. 1:09-ccv-00165-GMS, Complaint for Patent Infringement, (D. Del. Filed Mar. 12, 2009).
Non-Final Action Closing Prosecution mailed Sep. 1, 2010, for Control No. 95/001,339, filed Apr. 10, 2010, 17 pages.
Non-Final Action Closing Prosecution mailed Jun. 21, 2011, for Control No. 95/001,381, filed Jun. 9, 2010, 34 pages.
Non-Final Action Closing Prosecution mailed Mar. 12, 2012, for Control No. 95/001,337, filed Apr. 19, 2010, 33 pages.
Non-Final Action mailed Aug. 27, 2010, for Control No. 95/000,546, filed May 11, 2010, 16 pages.
Non-Final Action mailed Sep. 8, 2010, for Control No. 95/001,381, filed Jun. 9, 2010, 17 pages.
Non-Final Action mailed Apr. 4, 2011, for Control No. 95/001,339, filed Apr. 20, 2010, 61 pages. (merged with 95/000,578 and 95/000,579).
Non-Final Action mailed Jun. 15, 2011, for Control No. 95/001,381, filed Jun. 9, 2010, 33 pages.
Non-Final Action mailed Sep. 27, 2011, for Control No. 95/001,337, filed Apr. 19, 2010, 19 pages.
Non-Final Action mailed Oct. 4, 2011, for Control No. 95/001,339, filed Apr. 20, 2010, 77 pages (merged with 95/000,578 and 95/000,579).
Non-Final Action mailed Oct. 14, 2011, for Control No. 95/001,339, filed Apr. 30, 2010, 99 pages. (merged with 95/000,578 and 95/000,579).
Non-Final Office Action mailed Nov. 16, 2011, for U.S. Appl. No. 95/001,758 filed Sep. 14, 2011, 25 pages.
Order Granting Request for Inter Partes Reexamination mailed Nov. 16, 2011, for U.S. Appl. No. 95/001,758, filed Sep. 14, 2011, 13 pages.
Order Granting Request for Inter Partes Reexamination mailed Aug. 9, 2010, for Control No. 95/000,546, filed May 11, 2010, 22 pages.
Order Granting Request for Inter Partes Reexamination mailed Aug. 27, 2010, for Control No. 95/001,337, filed Apr. 19, 2010, 21 pages.
Order Granting Request for Inter Partes Reexamination mailed Sep. 1, 2010, for Control No. 95/001,339, filed Apr. 20, 2010, 14 pages.
Order Granting Request for Inter Partes Reexamination mailed Sep. 8, 2010, for Control No. 95/000,381, filed Jun. 9, 2010, 21 pages.
Order Granting Request for Inter Partes Reexamination mailed Jan. 14, 2011, for Control No. 95/000,579, filed Oct. 21, 2010, 12 pages.
Order Granting Request for Inter Partes Reexamination mailed Jan. 18, 2011, for Control No. 95/000,577, filed Oct. 20, 2010, 17 pages.
Right of appeal Notice mailed Feb. 7, 2012, for Control No. 95/001,381, 33 pages.
Right of Appeal Notice mailed Jun. 22, 2012, for Control No. 95/001,337, filed Jun. 4 2010, 34 pages.
PC133 SDRAM Registered DIMM Design Specification, Revision 1.1, Aug. 1999, 62 pages.
Texas Instruments, "TM2SR72EPN 2097152 by 72-Bit, TM4SRT2EPN 4194304 by 72-Bit, Synchronous Dynamic RAM Modules," 1997, 15 pages.
U.S. District Court Central District of California, Case No. CV09 06900, *Netlist, Inc. vs. Inphi Corporation*, Complaint for Patent Infringement, filed Sep. 22, 2009 in 10 pages.
U.S. District Court Central District of California, Case No. CV09 06900, *Netlist, Inc. vs. INPHI Corporation*, Defendant Inphi Corporation's Answer to Plaintiff's Complaint for Patent Infringement, filed Nov. 12, 2009 in 6 pages.
U.S. District Court Central District of California, Case No. CV09 06900, *Netlist, Inc. vs. Inphi Corporation*, Defendant Inphi Corporation's Answer to Plaintiff's First Amended Complaint for Patent Infringement, filed Feb. 11, 2010 in 9 pages.
U.S. District Court Central District of California, Case No. CV09 06900, *Netlist, Inc. vs. INPHI Corporation*, Defendant Inphi Corporation's Notice of Motion and Motion for Stay Pending Reexaminations and Interference Proceeding Regarding the Patents-In-Suit; Memorandum of Points and Authorities in Support Thereof, filed Apr. 21, 2010 in 28 pages.
U.S. District Court Central District of California, Case No. CV09 06900, *Netlist, Inc. vs. INPHI Corporation*, Plaintiff Netlist Inc's Opposition to Defendant Inphi Corporation's Motion for Stay Pending Reexaminations and Interference Proceedings Regarding the Patents-In-Suit, filed May 3, 2010 in 23 pages.
U.S. District Court Central District of California, Case No. CV09 06900, *Netlist, Inc. vs. Inphi Corporation*, Plaintiff Netlist, Inc's First Amended Complaint for Patent Infringement, filed Dec. 23, 2009 in 8 pages.
U.S. District Court Northern District of California, Case No. CV08 04144, *Google Inc. v. Netlist, Inc.*, Defendant Netlist, Inc.'s Claim Construction Reply Brief, filed Sep. 22, 2009 in 19 pages.
U.S. District Court Northern District of California, Case No. CV08 04144, *Google Inc. v. Netlist, Inc.*, Defendant Netlist, Inc.'s Opening Claim Construction Brief, filed Jul. 28, 2009 in 21 pages.
U.S. District Court Northern District of California, Case No. CV08 04144, *Google Inc. v. Netlist, Inc.*, Defendant Netlist, Inc.'s Opposition to Google Inc's Motion for Summary Judgment of Invalidity, filed Jul. 6, 2010 in 13 pages.
U.S. District Court Northern District of California, Case No. CV08 04144, *Google Inc. v. Netlist, Inc.*, Exhibit A to Joint Claim Construction and Prehearing Statement, filed Jun. 12, 2009 in 2 pages.
U.S. District Court Northern District of California, Case No. CV08 04144, *Google Inc. v. Netlist, Inc.*, Exhibit B to Joint Claim Construction and Prehearing Statement, filed Jun. 12, 2009 in 36 pages.
U.S. District Court Northern District of California, Case No. CV08 04144, *Google Inc. v. Netlist, Inc.*, Joint Claim Construction and Prehearing Statement, filed Jun. 12, 2009 in 5 pages.
U.S. District Court Northern District of California, Case No. CV08 04144, *Google Inc. v. Netlist, Inc.*, Netlist, Inc.'s Answer to Complaint and Counterclaims, filed Nov. 18, 2008 in 9 pages.
U.S. District Court Northern District of California, Case No. CV08 04144, *Google Inc. v. Netlist, Inc.*, Order Re Claim Construction, filed Nov. 16, 2009 in 1 page.
U.S. District Court Northern District of California, Case No. CV08 04144, *Google Inc. v. Netlist, Inc.*, Plaintiff Google's Reply to Counterclaims, filed Dec. 8, 2008 in 4 pages.

(56) References Cited

OTHER PUBLICATIONS

U.S. District Court Northern District of California, Case No. CV08 04144, *Google Inc. v. Netlist, Inc.*, Stipulation Re: Additional Agreed-Upon Claim Constructions,filed Oct. 28, 2009 in 3 pages.

U.S. District Court Northern District of California, Case No. CV08 04144, *Google Inc. vs. Netlist, Inc.*, [Redacted] Google Inc.'s Responsive Claim Construction Brief, filed Aug. 25, 2009 in 30 pages.

U.S. District Court Northern District of California, Case No. CV08 04144, *Google Inc. vs. Netlist, Inc.*, Amended Exhibit A to Joint Claim Construction and Prehearing Statement, filed Oct. 28, 2009 in 1 page.

U.S. District Court Northern District of California, Case No. CV08 04144, *Google Inc. vs. Netlist, Inc.*, Appendix 1 to Google's Responsive Claim Construction Brief, filed Nov. 12, 2009 in 4 pages.

U.S. District Court Northern District of California, Case No. CV08 04144, *Google Inc. vs. Netlist, Inc.*, Attachment 1 to Exhibit B to Joint Claim Construction and Prehearing Statement, filed Jun. 12, 2009 in 7 pages.

U.S. District Court Northern District of California, Case No. CV08 04144, *Google Inc. vs. Netlist, Inc.*, Attachment 2 to Exhibit B to Joint Claim Construction and Prehearing Statement, filed Jun. 12, 2009 in 12 pages.

U.S. District Court Northern District of California, Case No. CV08 04144, *Google Inc. vs. Netlist, Inc.*, Complaint for Declaratory Relief, filed Aug. 29, 2008 in 49 pages.

U.S. District Court Northern District of California, Case No. CV09 05718, *Netlist, Inc. vs. Google, Inc.*, Complaint for Patent Infringement, filed Dec. 4, 2009 in 47 pages.

U.S. District Court Northern District of California, Case No. CV09 05718, *Netlist, Inc. vs. Google, Inc.*, Defendant Google Inc's Responsive Claim Construction Brief, filed Aug. 4, 2010 in 108 pages.

U.S. District Court Northern District of California, Case No. CV09 05718, *Netlist, Inc. vs. Google, Inc.*, Exhibit A to Joint Claim Construction and Prehearing Statement under Patent L.R. 4-3, filed Jun. 25, 2010 in 2 pages.

U.S. District Court Northern District of California, Case No. CV09 05718, *Netlist, Inc. vs. Google, Inc.*, Exhibit B to Joint Claim Construction and Prehearing Statement under Patent L.R. 4-3, filed Jun. 25, 2010 in 23 pages.

U.S. District Court Northern District of California, Case No. CV09 05718, *Netlist, Inc. vs. Google, Inc.*, Google's Answer to Plaintiff's Complaint for Patent Infringement; and Assertion of Counterclaims, filed Feb. 12, 2010 in 13 pages.

U.S. District Court Northern District of California, Case No. CV09 05718, *Netlist, Inc. vs. Google, Inc.*, Joint Claim Construction and Prehearing Statement Under Patent Local Rule 4-3, filed Jun. 25, 2010 in 5 pages.

U.S. District Court Northern District of California, Case No. CV09 05718, *Netlist, Inc. vs. Google, Inc.*, Plaintiff Netlist, Inc.'s Reply Claim Construction Brief, filed Aug. 16, 2010 in 17 pages.

U.S. District Court Northern District of California, Case No. CV09 05718, *Netlist, Inc. vs. Google, Inc.*, Plaintiff Netlist, Inc.'s Reply to Defendant Google Inc.'s Counterclaim, filed Mar. 8, 2010 in 11 pages.

U.S. District Court Northern District of California, Case No. CV09 05718, *Netlist, Inc. vs. Google, Inc.*, Plaintiff Netlist, Inc's Opening Claim Construction Brief, filed Jul. 16, 2010 in 162 pages.

US District Court Civil Docket; *Google Inc. v. Netlist Inc.*; 4:08cv04144; filed Aug. 29, 2008.

US District Court Civil Docket; *Netlist Inc. v. Google Inc.*; 4:09cv5718, filed Dec. 4, 2009 in 10 pages.

US District Court Civil Docket; *Netlist Inc. v. Inphi Corporation*; 2:09cv6900; Date filed Sep. 22, 2009.

Vogt, Pete, "Fully Buffered DIMM (FB-DIMM) Server Memory Architecture: Capacity, Performance, Reliability, and Longevity," Intel, Feb. 18, 2004, 33 pages.

Inter Partes Review Case No. IPR2014-01029, Petition for Inter Partes Review of U.S. Pat. No. 8,516,185, filed on Jun. 24, 2014.

Inter Partes Review Case No. IPR2014-01029, Exhibit 1008 to Petition for Inter Partes Review, "Declaration of Charles J. Neuhauser, Ph.D. under 37 C.F.R. § 1.68," filed on Jun. 24, 2014.

Inter Partes Review Case No. IPR2014-01029, Supplemental Petition for Inter Partes Review of U.S. Pat. No. 8,516,185, filed on Jul. 23, 2014.

Inter Partes Review Case No. IPR2014-01029, Patent Owner's Preliminary Response pursuant to 37 C.F.R. § 42.107, filed on Oct. 17, 2014.

Inter Partes Review Case No. IPR2014-01029, Decision Denying Institution of Inter Partes Review 37 C.F.R. § 42.108, issued Dec. 16, 2014.

Inter Partes Review Case No. IPR2014-01369, Corrected Petition for Inter Partes Review of Claims 1-19 of U.S. Pat. No. 8,516,185, filed on Sep. 22, 2014.

Inter Partes Review Case No. IPR2014-01369, Exhibit 1008 to Corrected Petition for Inter Partes Review, "Declaration of Dr. Nader Bagherzadeh under 37 C.F.R. § 1.68," filed on Sep. 22, 2014.

Inter Partes Review Case No. IPR2014-01369, Exhibit 1013 to Corrected Petition for Inter Partes Review, "Webster's II New College Dictionary," filed on Sep. 22, 2014.

Inventor Inter Partes Review Case No. IPR2014-01369, Exhibit 1014 to Corrected Petition for Inter Partes Review, "Standard Dictionary of Electrical and Electronics Terms," IEEE 1988, filed on Sep. 22, 2014.

Inter Partes Review Case No. IPR2014-00882, Corrected Petition for Inter Partes Review of U.S. Pat. No. 7,881,150, filed on Jul. 8, 2014.

Inter Partes Review Case No. IPR2014-00882, Exhibit 1007 to Petition for Inter Partes Review, "Declaration of Dr. Srinivasan Jagannathan," filed on Jun. 22, 2014.

Inter Partes Review Case No. IPR2014-00883, Corrected Petition for Inter Partes Review of U.S. Pat. No. 8,081,536, filed on Jul. 8, 2014.

Inter Partes Review Case No. IPR2014-00883, Exhibit 1011 to Petition for Inter Partes Review, "Declaration of Dr. Srinivasan Jagannathan," filed on Jun. 21, 2014.

Inter Partes Review Case No. IPR2014-01011, Corrected Petition for Inter Partes Review of U.S. Pat. No. 7,881,150, filed on Jul. 8, 2014.

U.S. District Court Northern District of California, Case No. 4:13-CV-05889-YGR, *Netlist, Inc. v. Smart Storage Systems, Inc., and Diablo Technologies, Inc.*, Smart Storage Systems, Inc.'s Invalidity Contentions, dated Jun. 6, 2014.

U.S. District Court Northern District of California, Case No. 4:13-CV-05889-YGR, *Netlist, Inc. v. Smart Storage Systems, Inc., and Diablo Technologies, Inc.* Exhibits E.1-E.7 to "Smart Storage Systems, Inc.'s Invalidity Contentions," dated Jun. 6, 2014.

U.S. District Court Northern District of California, Case No. 4:13-CV-05889-YGR, *Netlist, Inc. v. Smart Storage Systems, Inc., and Diablo Technologies, Inc.* Exhibits F.1-F.5 to "Smart Storage Systems, Inc.'s Invalidity Contentions," dated Jun. 6, 2014.

U.S. District Court Northern District of California, Case No. 4:13-CV-05889-YGR, *Netlist, Inc. v. Smart Storage Systems, Inc., and Diablo Technologies, Inc.* Exhibits G.1-G.6 to "Smart Storage Systems, Inc.'s Invalidity Contentions," dated Jun. 6, 2014.

U.S. District Court Northern District of California, Case No. 4:13-CV-05889-YGR, *Netlist, Inc. v. Smart Storage Systems, Inc., and Diablo Technologies, Inc.* Exhibit H to "Smart Storage Systems, Inc.'s Invalidity Contentions," dated Jun. 6, 2014.

U.S. District Court Northern District of California, Case No. 4:13-Cv-05889-YGR, *Netlist, Inc. v. Smart Storage Systems, Inc., and Diablo Technologies, Inc.* Diablo Technologies, Inc.'s Invalidity Contentions, dated Jun. 6, 2014.

U.S. District Court Northern District of California, Case No. 4:13-CV-05889-YGR, *Netlist, Inc. v. Smart Storage Systems, Inc., and Diablo Technologies, Inc.*, Exhibits D-1 to D6 to "Diablo Technologies, Inc.'s Invalidity Contentions," dated Jun. 6, 2014.

(56) References Cited

OTHER PUBLICATIONS

U.S. District Court Northern District of California, Case No. 4:13-CV-05889-YGR, *Netlist, Inc. v. Smart Storage Systems, Inc., and Diablo Technologies, Inc.*, Exhibits F-1 to F-5 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits G-1 to G-6 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Diablo Technologies, Inc.'s Invalidity Contentions," dated Jun. 6, 2014.
International Search Report and Written Opinion, International Application No. PCT/US14/48517, filed Jul. 28, 2014, dated Oct. 27, 2014.
Inter Partes Review Case No. IPR2014-01029, Petitioner's Request for Rehearing pursuant to 37 C.F.R. § 42.71, filed on Jan. 15, 2015.
Inter Partes Review Case No. IPR2014-01029, Decision Denying Request for Rehearing, Issued on Mar. 3, 2015.
Inter Partes Review Case No. IPR2014-01369, Decision Denying Institution of Inter Partes Review 37 C.F.R. § 42.108, issued Mar. 9, 2014.
Examination Report, European Patent Application No. 10730021.2, dated Apr. 14, 2014.
Response to Examination Report, European Patent Application No. 10730021.2, dated Jun. 4, 2014.
Examination Report, European Patent Application No. 10730021.2, dated Apr. 29, 2015.
Inter Partes Review Case No. IPR2014-01011, Exhibit 1007 to Petition for Inter "Declaration of Dr. Srinivasan Jagannathan," filed on Jun. 22, 2014.
McCluskey, Edward J., Logic Design Principles with Emphasis on Testable Semicustom Circuits, Prentice Hall, 1986, pp. 104-107 and 119-120.
Inter Partes Review of U.S. Pat. No. 7,881,150, Case No. IPR2015-01020, Petitioner's Reply, filed May 19, 2016.
Inter Partes Review of U.S. Pat. No. 7,881,150, Case No. IPR2015-01020, Petitioner Request for Oral Argument, filed Jun. 2, 2016.
Inter Partes Review of U.S. Pat. No. 7,881,150, Case No. IPR2015-01020, Patent Owner Motion for Observations, filed Jun. 2, 2016.
Inter Partes Review of U.S. Pat. No. 7,881,150, Case No. IPR2015-01020, Patent Owner Request for Oral Argument, filed Jun. 2, 2016.
Inter Partes Review of U.S. Pat. No. 7,881,150, Case No. IPR2015-01020, Order Trial Hearing, filed Jun. 8, 2016.
Inter Partes Review of U.S. Pat. No. 7,881,150, Case No. IPR2015-01020, Patent Owner's Submission on Propriety of Petitioner Reply, filed Jun. 9, 2016.
Inter Partes Review of U.S. Pat. No. 7,881,150, Case No. IPR2015-01020, Petitioner's Response to Motion for Observations, filed Jun. 10, 2016.
Inter Partes Review of U.S. Pat. No. 7,881,150, Case No. IPR2015-01020, Petitioner's Response to Netlist's Submission, filed Jun. 13, 2016.
Inter Partes Review of U.S. Pat. No. 7,881,150, Case No. IPR2015-01020, Patent Owner's Objections to Petitioner's Demonstrative Exhibits, filed Jun. 23, 2016.
Inter Partes Review of U.S. Pat. No. 7,881,150, Case No. IPR2015-01020, Patent Owner's Demonstrative Exhibits, filed Jun. 24, 2016.
Inter Partes Review of U.S. Pat. No. 7,881,150, Case No. IPR2015-01020, Petitioner's Updated Exhibit List, filed Jun. 24, 2016.
Inter Partes Review of U.S. Pat. No. 7,881,150, Case No. IPR2015-01020, Supplemental Declaration of Dr. Jagannathan, filed May 19, 2016.
Inter Partes Review of U.S. Pat. No. 7,881,150, Case No. IPR2015-01020, May 10, 2016 Deposition of Carl Sechen, filed May 19, 2016.
Inter Partes Review of U.S. Pat. No. 7,881,150, Case No. IPR2015-01020, Petitioner's Demonstrative Exhibits, filed Jun. 24, 2016.
Inter Partes Review of U.S. Pat. No. 8,081,536, Case No. IPR2015-01021, Petitioner's Reply, filed May 19, 2016.
Inter Partes Review of U.S. Pat. No. 8,081,536, Case No. IPR2015-01021, Petitioner Request for Oral Argument, filed Jun. 2, 2016.
Inter Partes Review of U.S. Pat. No. 8,081,536, Case No. IPR2015-01021, Patent Owner Motion for Observations, filed Jun. 2, 2016.
Inter Partes Review of U.S. Pat. No. 8,081,536, Case No. IPR2015-01021, Patent Owner Request for Oral Argument, filed Jun. 2, 2016.
Inter Partes Review of U.S. Pat. No. 8,081,536, Case No. IPR2015-01021, Patent Owner's Submission on Propriety of Petitioner Reply, filed Jun. 9, 2016.
Inter Partes Review of U.S. Pat. No. 8,081,536, Case No. IPR2015-01021, Petitioner's Response to Motion for Observations, filed Jun. 10, 2016.
Inter Partes Review of U.S. Pat. No. 8,081,536, Case No. IPR2015-01021, Petitioner's Response to Patent Owner's Submission, filed Jun. 13, 2016.
Inter Partes Review of U.S. Pat. No. 8,081,536, Case No. IPR2015-01021, Patent Owner's Objections to Petitioner's Demonstrative Exhibits, filed Jun. 23, 2016.
Inter Partes Review of U.S. Pat. No. 8,081,536, Case No. IPR2015-01021, Patent Owner's Demonstrative Exhibits, filed Jun. 24, 2016.
Inter Partes Review of U.S. Pat. No. 8,081,536, Case No. IPR2015-01021, Petitioner's Updated Exhibit List, filed Jun. 24, 2016.
Inter Partes Review of U.S. Pat. No. 8,081,536, Case No. IPR2015-01021, Supplemental Declaration of Dr. Jagannathan, filed May 19, 2016.
English Translation of the Notice of Grounds for Rejection, Korean Patent Application No. 2012-7004038, dated May 11, 2016.
Inter Partes Review of U.S. Pat. No. 7,881,150, Case No. IPR2015-01020, Patent Owner Response to Petition, filed Feb. 22, 2016.
Inter Partes Review of U.S. Pat. No. 7,881,150, Case No. IPR2015-01020, Petitioner's Objections to Evidence, filed Feb. 29, 2016.
Inter Partes Review of U.S. Pat. No. 7,881,150, Case No. IPR2015-01020, Exhibit 2001, "Declaration of Professor Carl Sechen," filed Feb. 22, 2016.
Inter Partes Review of U.S. Pat. No. 7,881,150, Case No. IPR2015-01020, Exhibit 2002, "Videotaped Deposition of Srinivasan Jagannathan, Ph.D on Feb. 12, 2016," filed Feb. 22, 2016.
Inter Partes Review of U.S. Pat. No. 7,881,150, Case No. IPR2015-01020, Exhibit 2003, "Videotaped Deposition of Srinivasan Jagannathan, Ph.D on Apr. 20, 2015," filed Feb. 22, 2016.
Inter Partes Review of U.S. Pat. No. 7,881,150, Case No. IPR2015-01020, Exhibit 2007, "Deposition of Dr. Srinivasan Jagannathan on May 25, 2016," filed Jun. 2, 2016.
Inter Partes Review of U.S. Pat. No. 8,081,536, Case No. IPR2015-01021, Patent Owner Response to Petition, filed Feb. 22, 2016.
Inter Partes Review of U.S. Pat. No. 8,081,536, Case No. IPR2015-01021, Petitioner's Objections to Evidence, filed Feb. 29, 2016.
Inter Partes Review of U.S. Pat. No. 8,081,536, Case No. IPR2015-01021, Exhibit 2001, "Declaration of Professor Carl Sechen," filed Feb. 22, 2016.
Response to Examination Report, European Patent Application No. 10730021.2, dated Apr. 29, 2015, filed Nov. 4, 2015.
Inter Partes Review of U.S. Pat. No. 8,756,364, Case No. IPR2017-00549, Petition for Inter Partes Review, filed Dec. 30, 2016.
Inter Partes Review of U.S. Pat. No. 8,756,364, Case No. IPR2017-00549, Exhibit 1003, "Declaration of Harold S. Stone," filed Dec. 30, 2016.
Inter Partes Review of U.S. Pat. No. 8,516,185, Case No. IPR2017-00577, Petition for Inter Partes Review, filed Jan. 5, 2017.
Inter Partes Review of U.S. Pat. No. 8,516,185, Case No. IPR2017-00577, Exhibit 1003, "Declaration of Harold S. Stone," filed Jan. 5, 2017.
Inter Partes Review of U.S. Pat. No. 8,516,185, Case No. IPR2017-00577, Exhibit 1010, Declaration of John J. Kelly Regarding Records of Joint Electron Device Engineering Council (JEDEC), filed Jan. 5, 2017.
JEDEC Standard Double Data Rate (DDR) SDRAM Specification, JESD79 (Jun. 2000).
Texas Instruments SN74LS245 octal bus transceivers with 3-state outputs datasheet, 2002.

(56) References Cited

OTHER PUBLICATIONS

Stone, H.S. Microcomputer Interfacing, Reading, MA: Addison Wesley, 1982.
128Mbit SDRAM, Samsung datasheet K4S281632C, Rev. 00. Mar. 2000.
G. Moore, "Cramming more components onto integrated circuits," Electronics, vol. 38, No. 8, Apr. 19, 1965.

* cited by examiner

Figure 1A: (Prior Art)
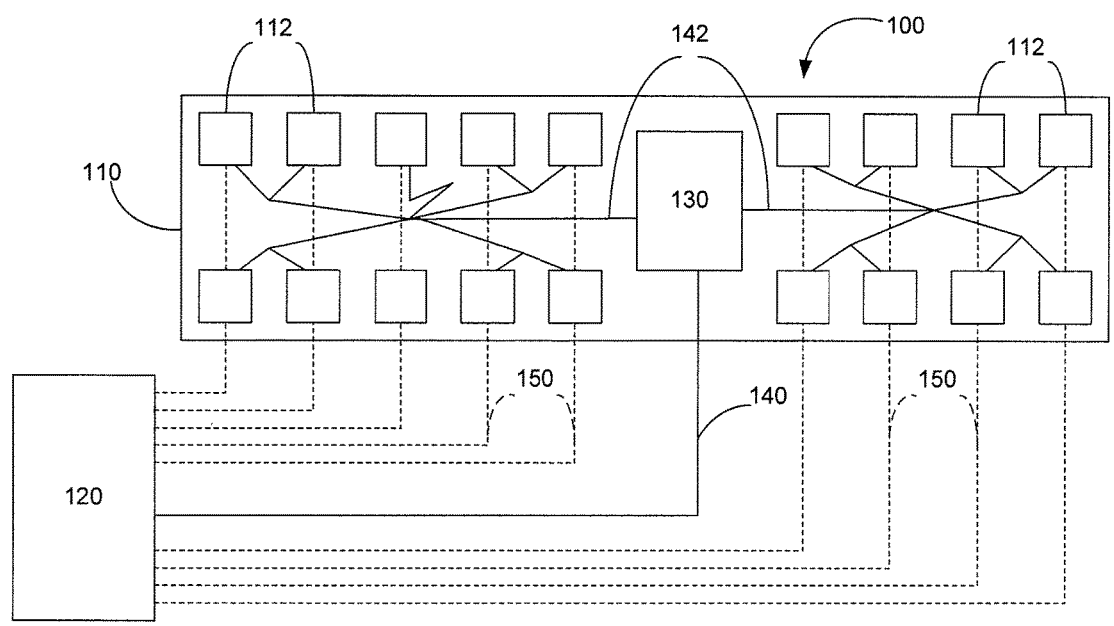

Figure 1B: (Prior Art)
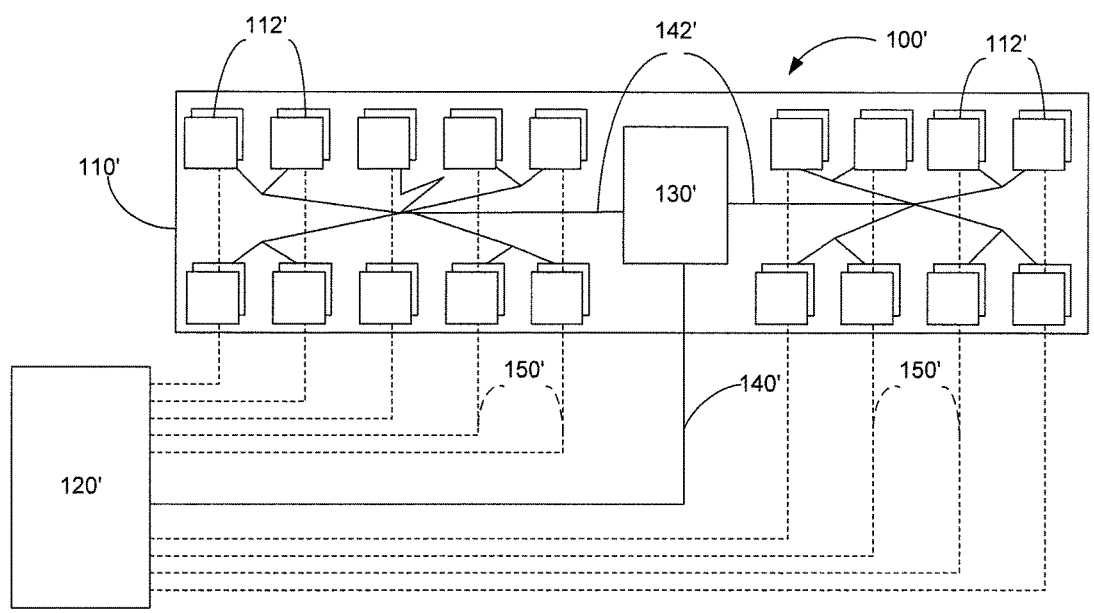

Figure 2A: (Prior Art)
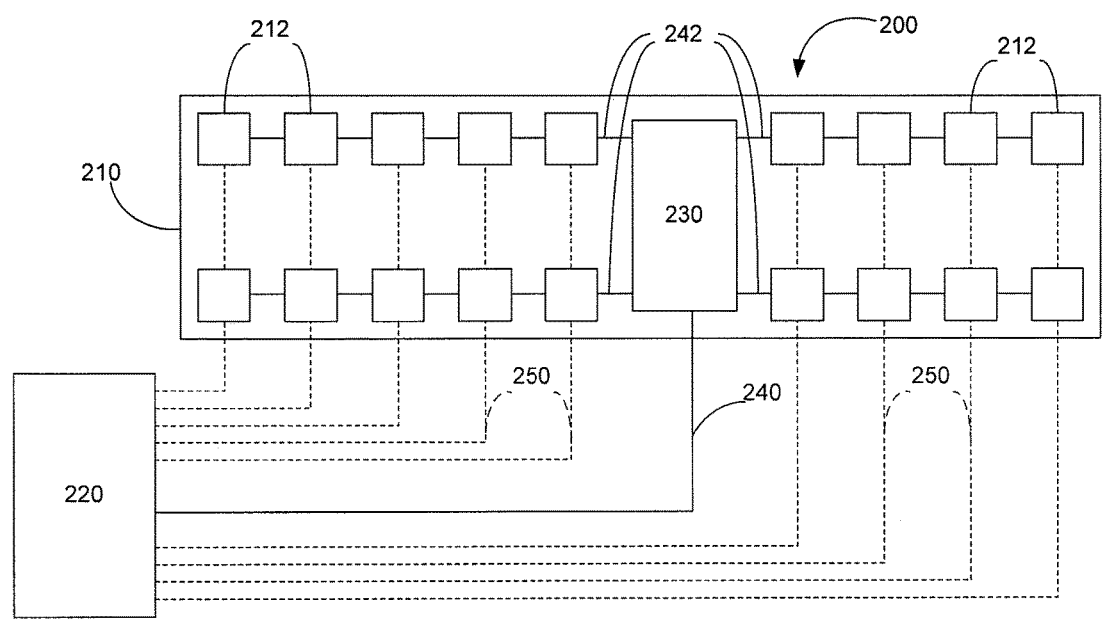

Figure 2B: (Prior Art)
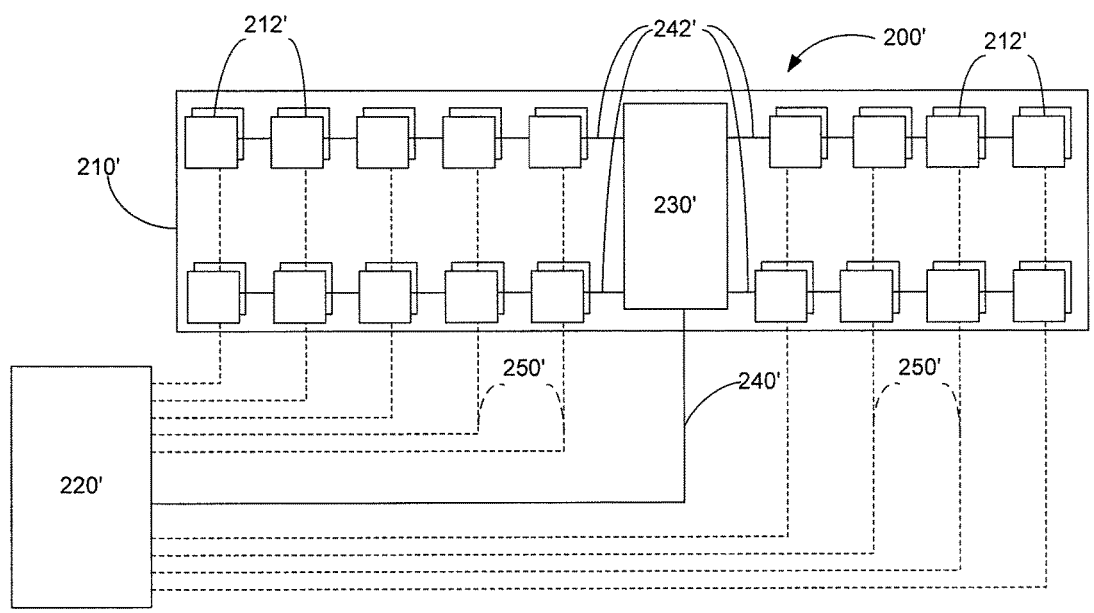

Figure 2C: (Prior Art)
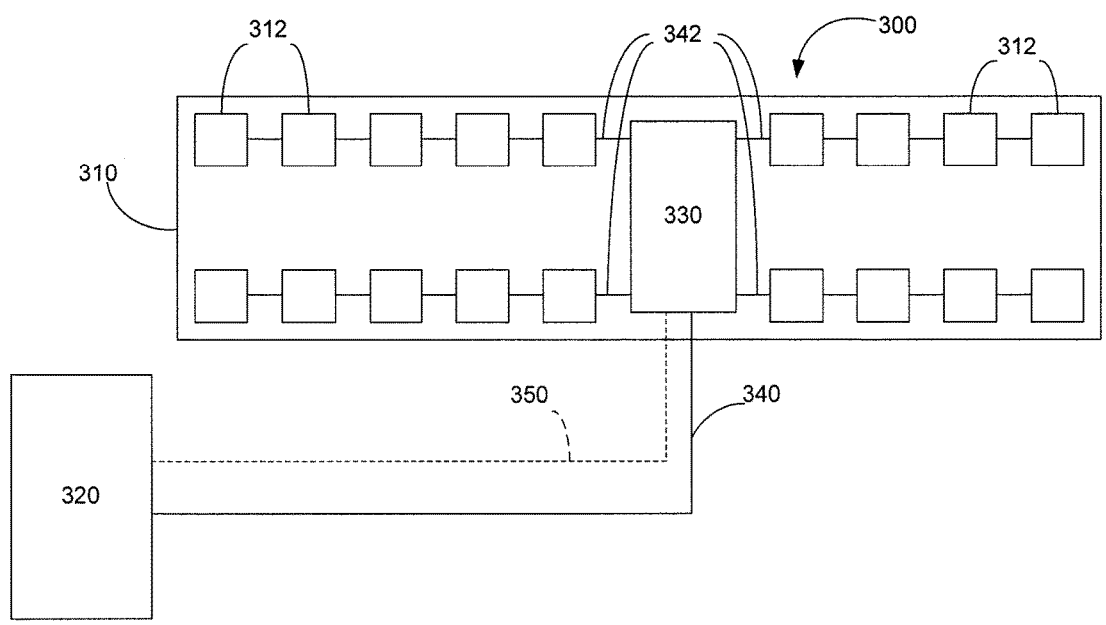

Figure 2D: (Prior Art)
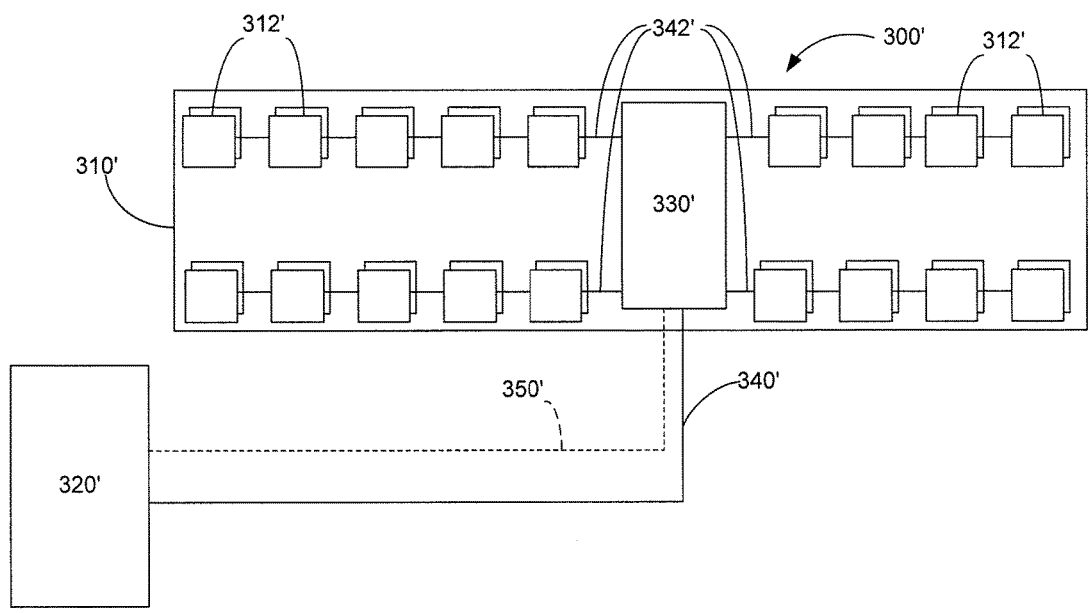

MEMORY MODULE WITH DISTRIBUTED DATA BUFFERS AND METHOD OF OPERATION

CROSS-REFERENCE TO RELATED APPLICATIONS

This application is a continuation from U.S. patent application Ser. No. 12/761,179, filed Apr. 15, 2010, now U.S. Pat. No. 8,516,185, which is a continuation-in-part from U.S. patent application Ser. No. 12/504,131, filed Jul. 16, 2009, now U.S. Pat. No. 8,417,870, each of which is incorporated in its entirety by reference herein.

BACKGROUND

The present disclosure relates generally to memory subsystems of computer systems, and more specifically to systems, devices, and methods for improving the performance and the memory capacity of memory subsystems or memory "boards," particularly memory boards that include dual in-line memory modules (DIMMs).

Certain types of computer memory subsystems include a plurality of dynamic random-access memory (DRAM) or synchronous dynamic random access memory (SDRAM) devices mounted on a printed circuit board (PCB). These memory subsystems or memory "boards" are typically mounted in a memory slot or socket of a computer system, such as a server system or a personal computer, and are accessed by the processor of the computer system. Memory boards typically include one or more memory modules, each with a plurality of memory devices (such as DRAMs or SDRAMs) in a unique configuration of rows, columns, and banks, which provide a total memory capacity for the memory module.

The memory devices of a memory module are generally arranged as ranks or rows of memory, each rank of memory generally having a bit width. For example, a memory module in which each rank of the memory module is 64 bits wide is described as having an "x64" or "by 64" organization. Similarly, a memory module having 72-bit-wide ranks is described as having an "x72" or "by 72" organization.

The memory capacity of a memory module increases with the number of memory devices. The number of memory devices of a memory module can be increased by increasing the number of memory devices per rank or by increasing the number of ranks. Rather than referring to the memory capacity of the memory module, in certain circumstances, the memory density of the memory module is referred to instead.

During operation, the ranks of a memory module are selected or activated by control signals that are received from the processor. Examples of such control signals include, but are not limited to, rank-select signals, also called chip-select signals. Most computer and server systems support a limited number of ranks per memory module, which limits the memory density that can be incorporated in each memory module.

The memory space in an electronic system is limited by the physically addressable space that is defined by the number of address bits, or by the number of chips selected. In general, once the memory space is defined for an electronic system, it would not be feasible to modify the memory space without an extensive design change. This is especially true for the case in which a memory space is defined by a consortium, such as the Joint Electron Device Engineering Council (JEDEC). A problem arises when a user's application requires a larger addressable memory space than the memory space that the current electronic system is designed to support.

In developing a memory subsystem, consideration is always given to memory density, power dissipation (or thermal dissipation), speed, and cost. Generally, these attributes are not orthogonal to each other, meaning that optimizing one attribute may detrimentally affect another attribute. For example, increasing memory density typically causes higher power dissipation, slower operational speed, and higher costs.

Furthermore, the specifications of the memory subsystem may be guided by physical limitations associated with these attributes. For example, high thermal dissipation may limit the speed of the operation, or the physical size of the memory module may limit the density of the module.

These attributes generally dictate the design parameters of the memory module, usually requiring that the memory system slow down operation speed if the memory subsystem is populated with more memory devices to provide higher density memory cards.

SUMMARY

In certain embodiments, a memory module is provided. The memory module comprises at least one printed circuit board and a plurality of memory devices mechanically coupled to the at least one printed circuit board. The memory module further comprises a control circuit mechanically coupled to the at least one printed circuit board. The control circuit is configurable to receive control signals from a system memory controller and to transmit module control signals to the plurality of memory devices. The memory module further comprises a plurality of data transmission circuits mechanically coupled to the at least one printed circuit board and distributed at corresponding positions relative to the at least one printed circuit board. The plurality of data transmission circuits is configurable to be operatively coupled to the system memory controller and configurable to receive module control signals from the control circuit. At least one first data transmission circuit of the plurality of data transmission circuits is operatively coupled to at least two memory devices of the plurality of memory devices. At least one second data transmission circuit of the plurality of data transmission circuits is operatively coupled to at least two memory devices of the plurality of memory devices. The at least one first data transmission circuit is configurable to respond to the module control signals by selectively allowing or inhibiting data transmission between the system memory controller and at least one selected memory device of the at least two memory devices operatively coupled to the at least one first data transmission circuit. The at least one second data transmission circuit is configurable to respond to the module control signals by selectively allowing or inhibiting data transmission between the system memory controller and at least one selected memory device of the at least two memory devices operatively coupled to the at least one second data transmission circuit.

In certain embodiments, a memory module is provided. The memory module comprises a plurality of memory devices and a controller configured to receive control information from a system memory controller and to produce module control signals. The memory module further comprises a plurality of circuits configured to selectively isolate the plurality of memory devices from the system memory controller. The circuits are operable, in response to the module control signals, to drive write data from the system memory controller to the plurality of memory devices and to merge read data from the plurality of memory devices to the system memory controller. The circuits are distributed at corresponding positions separate from one another.

In certain embodiments, a method of operating a memory module comprising a plurality of memory devices is provided. The method comprises providing a data transmission circuit on a data line between a computer system memory controller and the plurality of memory devices of the memory module. The data transmission circuit comprises a byte-wise buffer. The method further comprises, during a write operation, enabling the data transmission circuit to drive a data signal from the computer system memory controller on one of a plurality of paths to the memory devices of the memory module. The method further comprises, during a read operation, enabling the data transmission circuit to merge a plurality of data signals from the memory devices of the memory module and driving the merged data signal to the computer system memory controller.

BRIEF DESCRIPTION OF THE DRAWINGS

A complete understanding of the present invention may be obtained by reference to the accompanying drawings, when considered in conjunction with the subsequent, detailed description, in which:

FIG. 1A is a schematic representation of a conventional memory subsystem populated with at least one JEDEC-standard two-rank memory module;

FIG. 1B is a schematic representation of a conventional memory subsystem populated with at least one JEDEC-standard four-rank memory module.

FIG. 2A is a schematic representation of another conventional memory subsystem populated with at least one two-rank memory module.

FIG. 2B is a schematic representation of another conventional memory subsystem populated with at least one four-rank memory module.

FIGS. 2C and 2D schematically illustrate a conventional two-rank memory module and a four-rank memory module, respectively, each comprising a memory buffer.

For purposes of clarity and brevity, like elements and components bear like designations and numbering throughout the figures.

DETAILED DESCRIPTION

Figure 3A:
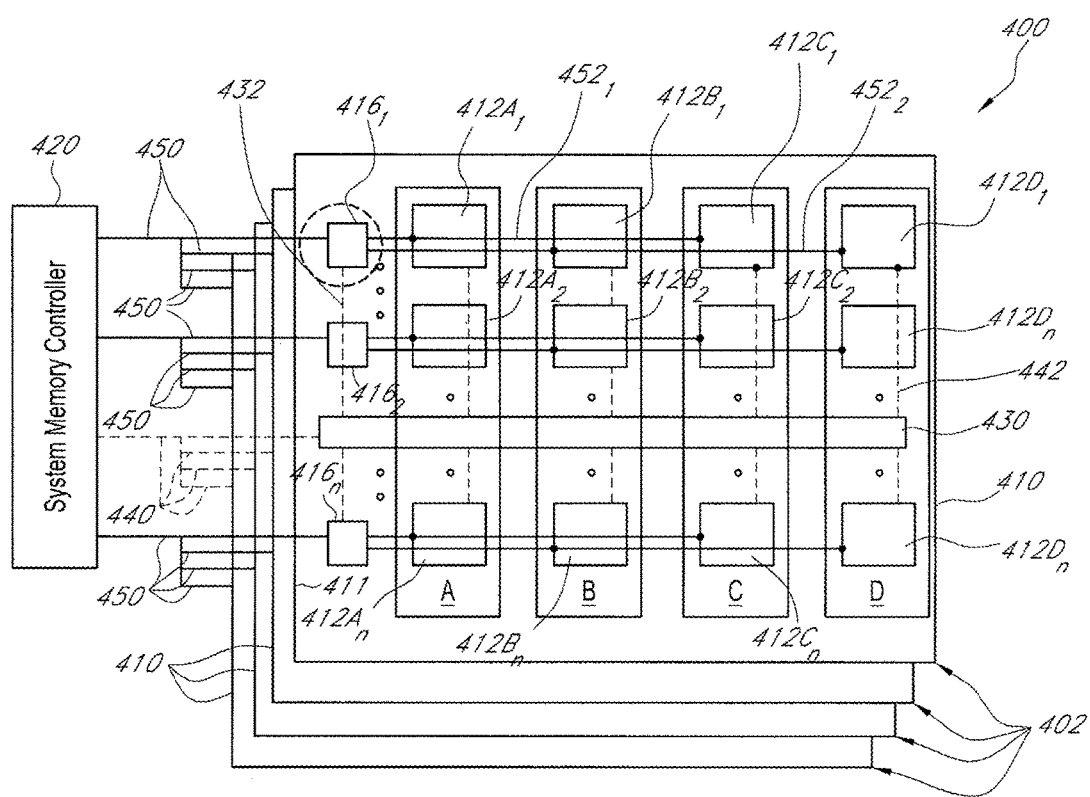
FIG. 3A is a schematic representation of an example memory subsystem in accordance with an embodiment of the disclosure.

One method for increasing memory space is based on an address decoding scheme. This method is very widely adopted in the electronics industry in designing Application-Specific Integrated Circuit (ASIC) and System-On-Chip (SOC) devices to expand system memories. Another method increases the addressable memory space without extensive alteration of the software or hardware of an existing electronics system. This method combines chip-select signals with an address signal to increase the number of physically addressable memory spaces (e.g., by a factor of 2, by a factor of 4, by a factor of 8, or by other factors as well).

These methods have several shortcomings. For example, since these methods increase the addressable memory space by directly adding memory chips, a heavier load is presented to the outputs of the system controller and the outputs of the memory devices, resulting in a slower system. Also, increasing the number of memory devices results in higher power dissipation. In addition, since an increase in the number of memory devices on each memory module alters the physical properties of the memory module while the system board remains the same, the overall signal (transmission line) wave characteristics deviate from the original design intent or specification. Furthermore, especially when registered DIMMs (RDIMMs) are used, the increase in the number of the memory devices translates to an increase in the distributed RC load on the data paths, but not on the control paths (e.g., address paths), thereby introducing uneven signal propagation delay between the data signal paths and control signal paths. As used herein, the terms "control lines" and "control paths" include address lines or paths and command lines or paths, and the term "control signals" includes address signals and command signals.

FIGS. 1A and 1B illustrate a prior art approach of increasing the number of memory devices. Specifically, FIG. 1A shows a conventional memory subsystem 100 with at least one JEDEC-standard two-rank memory module 110, such as a registered dual in-line memory module (RDIMM), only one of which is shown for clarity. Each rank of the memory module 110 comprises a plurality of memory devices 112, such as dynamic random access memory (DRAM) devices or synchronous DRAM (SDRAM) devices. A register 130 receives a plurality of control lines 140 (shown as a single solid line) from the system memory controller 120 and is connected via control lines 142 to the memory devices 112 of each rank of the memory module 110. This memory subsystem 100 connects each data line of an array of data lines 150 (shown as dashed lines) from a system memory controller 120 to corresponding memory devices 112 in the two ranks in each memory module 110. Therefore, during a write operation, the system memory controller 120 sees all the memory devices 112 as its load via the data lines 150, and during a read operation, each memory device 112 sees multiple other memory devices 112, as well as the system memory controller 120, as its load via the data lines 150.

FIG. 1B is a schematic view of another conventional memory subsystem 100' with at least one JEDEC-standard four-rank memory module 110' (only one of which is shown for clarity), each rank comprising a plurality of memory devices 112'. The register 130' receives the plurality of control lines 140' (shown as a single solid line) from the system memory controller 120' and is connected via control lines 142' to the memory devices 112' of each rank of the memory module 110'. Each data line of the array of data lines 150' (shown as dashed lines) from the system memory controller 120' is connected (e.g., by four fanouts) to corresponding memory devices 112' in the four ranks in each memory module 110'. Therefore, as with the two-rank memory module 110 shown in FIG. 1A, during a write operation, the system memory controller 120' sees all the memory devices 112' as its load via the data lines 150', and during a read operation, each memory device 112' sees multiple other memory devices 112' and the system memory controller 120' as its load via the data lines 150'.

For both the conventional two-rank memory module 110 and the conventional four-rank memory module 110', the multiple loads seen by the memory controller 120, 120' during write operations and the multiple loads seen by the memory devices 112, 112' during read operations cause significant performance issues. For example, for synchronous operation, time delays of the various signals are desired to be substantially equal to one another such that the operation of the memory module 110, 110' is synchronized with the system bus of the computer system. Thus, the trace lengths of the memory module 110, 110' are selected such that the signals are at the same clock phase. For example, the lengths of the control lines 142, 142' from the register 130, 130' to each of the memory devices 112, 112' are substantially equal to one another. However, for faster clock speeds, small errors in the trace lengths make such synchronous operation difficult or impossible. Therefore, these prior art techniques not only reduce the speed of the memory systems, but they also require hardware modifications to minimize any deviation of the transmission line wave characteristics from the original design specification.

FIGS. 2A and 2B illustrate another prior art approach of increasing the number of memory devices. Specifically, FIG. 2A shows a conventional memory subsystem 200 with at least one two-rank memory module 210, only one of which is shown for clarity. Each rank of the memory module 210 comprises a plurality of memory devices 212, such as dynamic random access memory (DRAM) devices or synchronous DRAM (SDRAM) devices. A register 230 receives a plurality of control lines 240 (shown as a single solid line) from the system memory controller 220 and is connected via control lines 242 to the memory devices 212 of each rank of the memory module 210. This memory subsystem 200 connects each data line of an array of data lines 250 (shown as dashed lines) from a system memory controller 220 to corresponding memory devices 212 in the two ranks in each memory module 210. Therefore, during a write operation, the system memory controller 220 sees all the memory devices 212 as its load via the data lines 250, and during a read operation, each memory device 212 sees multiple other memory devices 212, as well as the system memory controller 220, as its load via the data lines 250.

FIG. 2B is a schematic view of another conventional memory subsystem 200' with at least one four-rank memory module 210' (only one of which is shown for clarity), each rank comprising a plurality of memory devices 212'. The register 230' receives the plurality of control lines 240' (shown as a single solid line) from the system memory controller 220' and is connected via control lines 242' to the memory devices 212' of each rank of the memory module 210'. Each data line of the array of data lines 250' (shown as dashed lines) from the system memory controller 220' is connected (e.g., by four fanouts) to corresponding memory devices 212' in the four ranks in each memory module 210'. Therefore, as with the two-rank memory module 210 shown in FIG. 2A, during a write operation, the system memory controller 220' sees all the memory devices 212' as its load via the data lines 250', and during a read operation, each memory device 212' sees multiple other memory devices 212' and the system memory controller 220' as its load via the data lines 250'.

For the memory modules 210, 210', the control lines 242, 242' have a "fly-by" configuration. In such a configuration, control signals are sent along the control lines 242, 242' (e.g., in a single-path daisy-chain) from the register 230, 230' to the memory devices 212, 212' of a given rank. These control signals reach each memory device 212, 212' of the rank sequentially, with the control signals first reaching the memory device 212, 212' having the shortest control line 242, 242', then reaching the memory device 212, 212' having the next-shortest control line 242, 242', and so on. For example, a control signal may reach the memory device 212, 212' having the longest control line 242, 242' a significant period of time after the same control signal reaches the memory device 212, 212' having the shortest control line 242, 242'. For synchronous operation, the memory subsystems 200, 200' have the data lines 250, 250' configured so that the time delays of the various data signals between the memory controller 220, 220' and the particular memory devices 212, 212' are substantially tailored such that the data signals and the control signals reach the particular memory device 212, 212' so that operation of the memory module 210, 210' is synchronized with the system bus of the computer system. Such "fly-by" configurations have been described as operating in "local sync" while having "global async."

For such "fly-by" configurations, the memory controller 220, 220' of FIGS. 2A and 2B is more complicated than the memory controller 120, 120' of FIGS. 1A and 1B in that the memory controller 220, 220' accounts for the time delays between the various memory devices 212, 212' and adjusts the timing of these signals appropriately for synchronous operation. However, in some situations, the clock cycle time is approximately equal to or less than the time difference (e.g., about 900 picoseconds) between the control signals reaching the memory device 212, 212' having the longest control line 242, 242' and reaching the memory device 212, 212' having the shortest control line 242, 242'. Under such situations, synchronous operation is not achievable. Thus, the time difference between the control signals reaching the memory devices 212, 212' at the extremes of the control lines 242, 242' provide a limit to the clock speed with which the memory module 210, 210' may be operated. These time differences, which can be more than one clock cycle, will limit the operational speed and performance of the memory module. In addition, as with the memory subsystems 100, 100' of FIGS. 1A and 1B, the "fly-by" memory subsystems 200, 200' of FIGS. 2A and 2B suffer from large loads which result in slower clock speeds.

One recent suggestion for the "fly-by" configurations is to provide a memory buffer which handles both the control signals and the data signals. FIGS. 2C and 2D schematically illustrate a conventional two-rank memory module 310 and a four-rank memory module 310', respectively, each comprising a memory buffer 330, 330'. The control lines 340, 340' provide conduits for control signals from the memory controller 320, 320' to the memory buffer 330, 330', and the control lines 342, 342' provide conduits for control signals from the memory buffer 330, 330' to the memory devices 312, 312'. The plurality of data lines 350, 350' (shown as one dashed line for clarity) provide conduits for data signals from the memory controller 320, 320' to the memory buffer 330, 330', and data lines (not shown for clarity) on the memory module 310, 310' provide conduits for data signals from the memory controller 320, 320' to the memory devices 312, 312'.

The configurations of FIGS. 2C and 2D seek to have both the data signals and the control signals going to the memory buffer 330, 330'. However, such configurations have significant drawbacks. To send the data signals to the various memory devices 312, 312', the memory module 310, 310' includes an extremely large number of data lines (not shown for clarity) coupling the memory buffer 330, 330' to the memory devices 312, 312'. For example, in certain circumstances, the memory buffer 330, 330' for an LRDIMM is a 628-pin device, which is extremely large. In addition, the logistics of tailoring the time delays of these many data lines is complicated or difficult to provide the desired timing of data signals from the memory buffer 330, 330' to the memory devices 312, 312'. Also, the memory module 310, 310' utilizes significant modifications of the memory controller 320, 320' since the memory buffer 330, 330' is taking over some of the control of data signal timing that conventional memory controllers have. Even so, the memory modules 310, 310' of FIGS. 2C and 2D can only operate in asynchronous mode, not synchronous mode, due to the long fly-by times as compared to the desired clock frequencies. For example, for a fly-by delay of 1 nanosecond, if the data rate is 1 Gb/second, there is the possibility of collisions on the data lines during read/write turnaround. To combat such collisions, the data rate can be slowed down or "dead" cycles can be inserted. The memory module 310, 310', as a single unit, cannot be operated in synchronous mode, but operates as locally synchronous, globally (DIMM level) asynchronous.

Figure 3B:
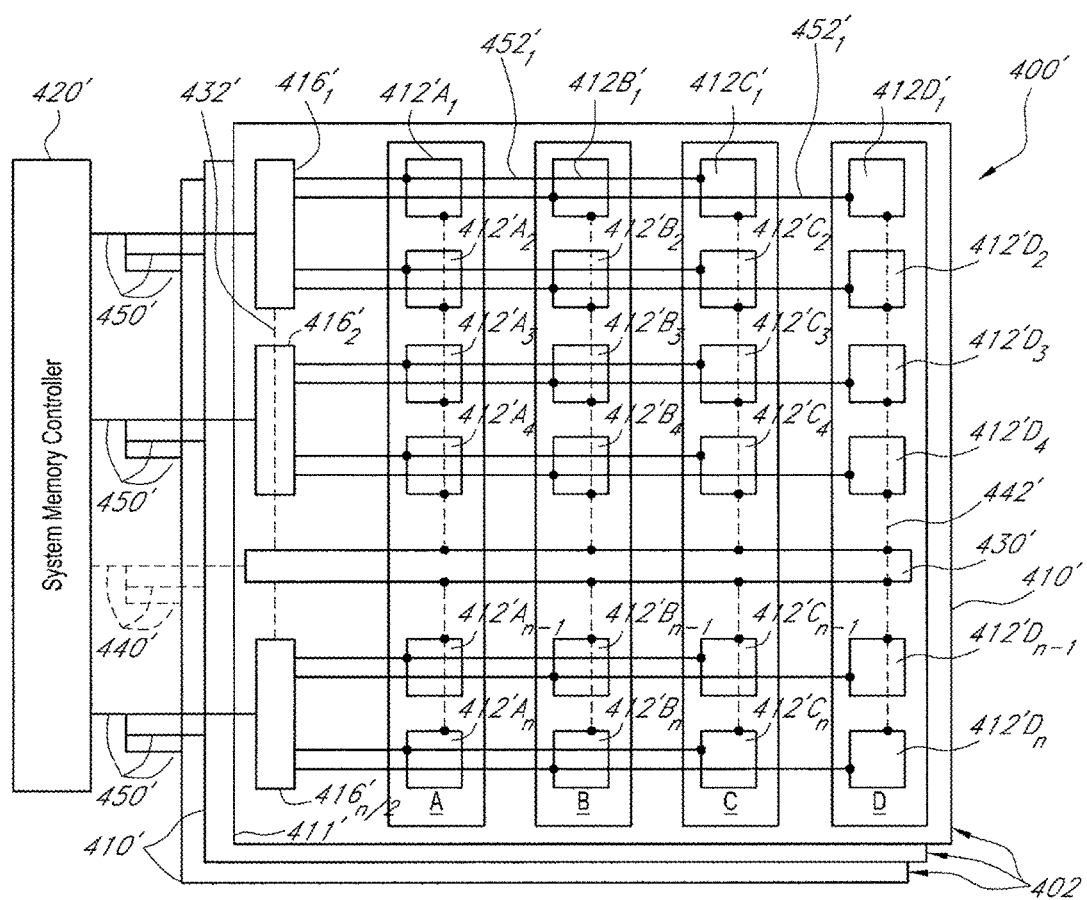
FIG. 3B schematically illustrates another example memory subsystem in accordance with certain embodiments described herein.
Figure 3C:
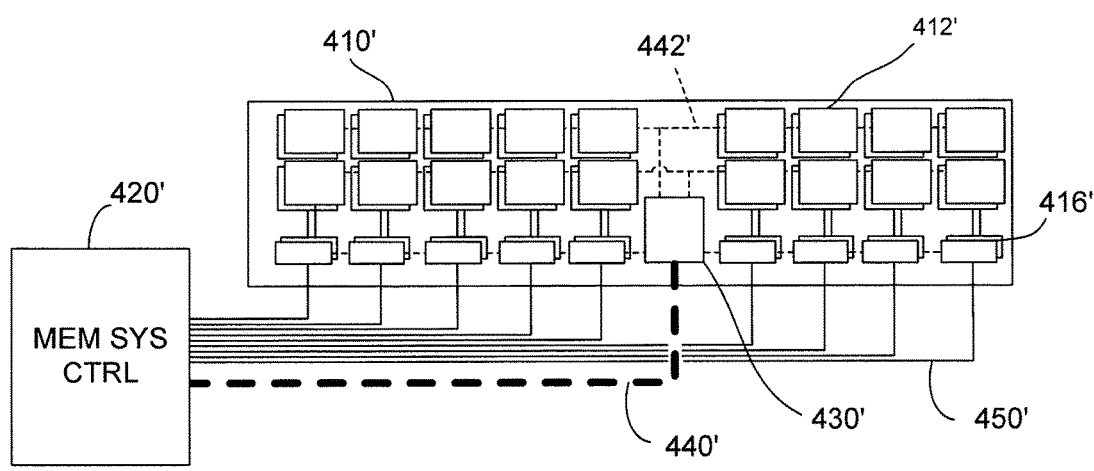
FIG. 3C schematically illustrates an example layout of the memory devices, the data transmission circuits, and the control circuit of a memory module in accordance with certain embodiments described herein.
Figure 3D:
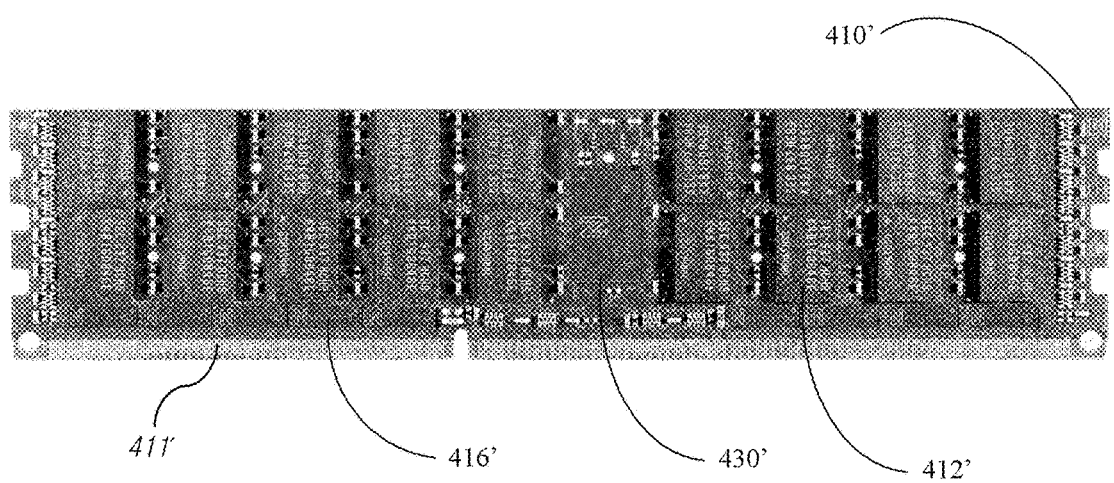
FIG. 3D is a photograph of an example memory subsystem in accordance with certain embodiments described herein.

FIG. 3A schematically illustrates an example memory subsystem 400 with load-reduced memory modules 402 in accordance with certain embodiments described herein. FIG. 3B schematically illustrates another example memory subsystem 400' with load-reduced memory modules 402' in accordance with certain embodiments described herein. FIG. 3C schematically illustrates an example layout of the memory devices 412', the data transmission circuits 416', and the control circuit 430' of a memory module 402' in accordance with certain embodiments described herein. FIG. 3D is a photograph of an example memory subsystem in accordance with certain embodiments described herein. In FIGS. 3A-3C, control lines (e.g., address and control lines 440, 440' coupling the system memory controller 420, 420' to the memory modules 410, 410') are shown as dashed lines, data lines (e.g., data lines 450, 450' coupling the system memory controller 420, 420' to the memory modules 410, 410') are shown as solid lines, and in FIGS. 3A and 3B, input/output connections are shown as black dots. In certain embodiments, as schematically illustrated by FIGS. 3A-3C, the address and control lines 440, 440' coupling the system memory controller 420, 420' to the memory module 410, 410' (e.g., to the control circuit 430, 430') are separate from the data lines 450, 450' coupling the system memory controller 420, 420' to the memory module 410, 410' (e.g., to the data transmission circuits 416, 416'). In certain embodiments, the memory subsystem 400, 400' is designed, for example, to deliver higher speed and higher memory density with lower thermal dissipation as compared with conventional memory subsystems. In the following discussion, aspects of the example subsystem 400 and corresponding components (e.g., memory modules 402, memory devices 412A, 412B, 412C, 412D, data transmission circuits 416, control circuit 430) and of the example subsystem 400' and corresponding components (e.g., memory modules 402', memory devices 412'A$_1$, 412'A$_2$, 412'B$_1$, 412'B$_2$, 412'C$_1$, 412'C$_2$, 412'D$_1$, 412'D$_2$, data transmission circuits 416', control circuit 430') should be understood to apply to certain other embodiments as well.

As schematically illustrated in FIGS. 3A and 3B, the example memory module 402, 402' comprises at least one printed circuit board 410, 410' and a plurality of memory devices 412, 412' mechanically coupled to the at least one printed circuit board 410, 410'. The memory module 402, 402' further comprises a control circuit 430, 430' mechanically coupled to the at least one printed circuit board 410, 410'. The control circuit 430, 430' is configurable to receive control signals from the system memory controller 420, 420' and to transmit module control signals to the plurality of memory devices 412, 412'. The memory module 402, 402' further comprises a plurality of data transmission circuits 416, 416' mechanically coupled to the at least one printed circuit board 410, 410' and distributed at corresponding positions relative to the at least one printed circuit board 410, 410'. The plurality of data transmission circuits 416, 416' is configurable to be operatively coupled to the system memory controller 420, 420' and configurable to receive module control signals from the control circuit 430, 430'. At least one first data transmission circuit of the plurality of data transmission circuits 416, 416' is operatively coupled to at least two memory devices of the plurality of memory devices 412, 412'. At least one second data transmission circuit of the plurality of data transmission circuits 416, 416' is operatively coupled to at least two memory devices of the plurality of memory devices 412, 412'. The at least one first data transmission circuit is configurable to respond to the module control signals by selectively allowing or inhibiting data transmission between the system memory controller 420, 420' and at least one selected memory device of the at least two memory devices operatively coupled to the at least one first data transmission circuit. The at least one second data transmission circuit is configurable to respond to the module control signals by selectively allowing or inhibiting data transmission between the system memory controller 420, 420' and at least one selected memory device of the at least two memory devices operatively coupled to the at least one second data transmission circuit.

As shown in FIGS. 3A and 3B, the memory subsystem 400, 400' is configurable to be operationally coupled to a system memory controller 420, 420', of a type well-known in the art (e.g., Intel Nehalem EP, EX chipsets; AMD Opteron chipset). The memory subsystem 400, 400' typically comprises one or more memory modules 402, 402', such as DIMMs or RDIMMs, additional details of which are shown only for one for clarity. Various types of memory modules 402, 402' are compatible with embodiments described herein. For example, memory modules having memory capacities of 512 MB, 1 GB, 2 GB, 4 GB, 8 GB, as well as other capacities, are compatible with embodiments described herein. In addition, memory modules having widths of 4 bytes, 8 bytes, 9 bytes, 16 bytes, 32 bytes, or 32 bits, 64 bits, 72 bits, 128 bits, 256 bits, as well as other widths (in bytes or in bits), are compatible with embodiments described herein. Furthermore, memory modules 402, 402' compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), fully-buffered DIMMs (FBDIMMs), mini-DIMMs, and micro-DIMMs.

The one or more memory modules 402, 402' comprise one or more printed circuit boards (PCBs) 410, 410', which may be arranged in a vertical stack (as shown), or in a back-to-back array. Each memory module 402, 402' in certain embodiments comprises a single PCB 410, 410', while in certain other embodiments, each of one or more of the memory modules 402 comprises multiple PCBs 410, 410'. In some embodiments, the PCBs 410, 410' are mountable in module slots (not shown) of the computer system. A PCB 410, 410' of certain such embodiments has at least one edge connector 411 comprising a plurality of electrical contacts which are positioned on an edge of the PCB 410, 410' (as shown in FIG. 3d) and are configured to be releasably coupled to corresponding contacts of a computer system socket to provide electrical conductivity between the system memory controller 420, 420' and the various components of the memory modules 402, 401' on the PCBs 410, 410'.

At least one memory module 402, 402' comprises a plurality of memory devices 412, 412' (such as DRAMs or SDRAMs). The memory devices 412, 412' of the memory module 402, 402' may advantageously be arranged in a plurality of rows or ranks. Memory devices 412, 412' compatible with embodiments described herein include, but are not limited to, random-access memory (RAM), dynamic random-access memory (DRAM), synchronous DRAM (SDRAM), and double-data-rate DRAM (e.g., DDR, DDR2, DDR3, etc.). In addition, memory devices 412, 412' having bit widths of 4, 8, 16, 32, as well as other bit widths, are compatible with embodiments described herein. Memory devices 412, 412' compatible with embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP).

In certain embodiments, the memory devices 412, 412' of the memory module 402, 402' are arranged in four ranks, although embodiments with less than four ranks (e.g., one rank, two ranks, three ranks) or more than four ranks (e.g., 6 ranks, 8 ranks) per memory module 402, 402' may be employed. In certain embodiments, each rank comprises eight or nine memory modules, while in certain other embodiments, other numbers of memory modules per rank may also be used. In certain embodiments, as schematically shown in FIG. 3A, the memory devices 412 are arranged in four ranks, denoted A, B, C, and D, and each rank comprises n memory devices. For the sake of this disclosure, in the example memory subsystem 400 of FIG. 3A, rank A comprises memory devices $412A_1$, $412A_2$, . . . , $412A_n$; rank B comprises memory devices $412B_1$, $412B_2$, . . . , $412B_n$; rank C comprises memory devices $412C_1$, $412C_2$, . . . , $412C_n$; and rank D comprises memory devices $412D_1$, $412D_2$, . . . , $412D_n$. For the sake of this disclosure, in the example memory subsystem 400' of FIG. 3B, rank A comprises memory devices $412'A_1$, $412'A_2$, . . . , $412'A_n$; rank B comprises memory devices $412'B_1$, $412'B_2$, . . . , $412'B_n$; rank C comprises memory devices $412'C_1$, $412'C_2$, . . . , $412'C_n$; and rank D comprises memory devices $412'D_1$, $412'D_2$, . . . , $412'D_n$.

In certain embodiments, at least one memory module 402, 402' comprises one or more electrical components (not shown) which may be mounted on the PCB 410, 410', within the PCB 410, 410', or both on and within the PCB 410, 410', and are operationally coupled to one another and to the plurality of memory devices 412, 412'. For example, the electrical components may be surface-mounted, through-hole mounted, embedded or buried between layers of the PCB 410, 410', or otherwise connected to the PCB 410, 410'. These electrical components may include, but are not limited to, electrical conduits, resistors, capacitors, inductors, transistors, buffers, registers, logic elements, or other circuit elements. In certain embodiments, at least some of these electrical components are discrete, while in other certain embodiments, at least some of these electrical components are constituents of one or more integrated circuits.

In certain embodiments, at least one memory module 402, 402' comprises a control circuit 430, 430' configured to be operatively coupled to the system memory controller 420, 420' and to the memory devices 412, 412' of the memory module 402, 402' (e.g., via lines 442, 442'). In certain embodiments, the control circuit 430, 430' may include one or more functional devices, such as a programmable-logic device (PLD), an application-specific integrated circuit (ASIC), a field-programmable gate array (FPGA), a custom-designed semiconductor device, or a complex programmable-logic device (CPLD). In certain embodiments, the control circuit 430, 430' may comprise one or more custom devices. In certain embodiments, the control circuit 430, 430' may comprise various discrete electrical elements; while in other embodiments, the control circuit 430, 430' may comprise one or more integrated circuits.

The control circuit 430, 430' of certain embodiments is configurable to be operatively coupled to control lines 440, 440' to receive control signals (e.g., bank address signals, row address signals, column address signals, address strobe signals, and rank-address or chip-select signals) from the system memory controller 420, 420'. The control circuit 430, 430' of certain embodiments registers signals from the control lines 440, 440' in a manner functionally comparable to the address register of a conventional RDIMM. The registered control lines 440, 440' are also operatively coupled to the memory devices 412, 412'. Additionally, the control circuit 430, 430' supplies control signals for the data transmission circuits 416, 416' (e.g., via lines 432, 432'), as described more fully below. The control signals indicate, for example, the direction of data flow, that is, to or from the memory devices 412, 412'. The control circuit 430, 430' may produce additional chip-select signals or output enable signals based on address decoding. Examples of circuits which can serve as the control circuit 430, 430' are described in more detail by U.S. Pat. Nos. 7,289,386 and 7,532,537, each of which is incorporated in its entirety by reference herein.

In certain embodiments, at least one memory module 402, 402' comprises a plurality of data transmission circuits 416, 416' mounted on the one or more PCBs 410, 410', within the one or more PCBs 410, 410', or both on and within the one or more PCBs 410, 410'. The plurality of data transmission circuits 416, 416' are operatively coupled to the control circuit 430, 430' (e.g., via lines 432, 432'), and configured to be operatively coupled to the system memory controller 420, 420' (e.g., via the data lines 450, 450') upon operatively coupling the memory module 402, 402' to the computer system. In certain embodiments, these data transmission circuits 416, 416' can be referred to as "load-reducing circuits" or "load-reducing switching circuits." As used herein, the terms "load-reducing" or "load-reducing switching" refer to the use of the data transmission circuits 416, 416' to reduce the load seen by the system memory controller 420, 420' when operatively coupled to the memory module 402, 402'. In certain embodiments, as schematically illustrated by FIG. 3A, the memory module 402 comprises n data transmission circuits 416, where n is the number of memory devices per rank of the memory module 410. For example, as schematically shown in FIG. 3A, the memory devices 412 of the memory module 410 are arranged in four ranks of n memory devices each, and the memory module 410 comprises at least a first data transmission circuit $416_1$ and a second data transmission circuit $416_2$. The first data transmission circuit $416_1$ of certain such embodiments is operatively coupled to at least one memory device 412 of each rank (e.g., memory devices $412A_1$, $412B_1$, $412C_1$, $412D_1$). The second data transmission circuit $416_2$ of certain such embodiments is operatively coupled to at least one memory device 412 of each rank (e.g., memory devices $412A_2$, $412B_2$, $412C_2$, $412D_2$). In certain embodiments, as schematically illustrated by FIG. 3B, the memory module 402' comprises n/2 data transmission circuits 416', where n is the number of memory devices per rank of the memory module 410'. For example, as schematically shown in FIG. 3B, the memory devices 412' of the memory module 410' are arranged in four ranks of n memory devices each, and the memory module 410' comprises at least a first data transmission circuit $416'_1$ and a second data transmission circuit $416'_2$. The first data transmission circuit $416'_1$ of certain such embodiments is operatively coupled to at least two memory devices 412' of each rank (e.g., memory devices $412'A_1$, $412'A_2$, $412'B_1$, $412'B_2$, $412'C_1$, $412'C_2$, $412'D_1$, $412'D_2$). The second data transmission circuit $416'_2$ of certain such embodiments is operatively coupled to at least two memory devices 412' of each rank (e.g., memory devices $412'A_3$, $412'A_4$, $412'B_3$, $412'B_4$, $412'C_3$, $412'C_4$, $412'D_3$, $412'D_4$).

In certain embodiments, at least one data transmission circuit 416, 416' selectively switches between two or more memory devices 412, 412' so as to operatively couple at least one selected memory device 412, 412' to the system memory controller 420, 420' (e.g., the data transmission circuit 416, 416' is configurable to respond to module control signals by selectively allowing or inhibiting data transmission between the system memory controller 420, 420' and at least one selected memory device 412, 412'). In certain such embodiments, the at least one data transmission circuit 416, 416' selectively operatively couples two selected memory devices to the system memory controller 420, 420'. For example, as schematically shown in FIG. 3A, the first data transmission circuit $416_1$ is configurable to respond to module control signals by selectively allowing or inhibiting data transmission between the system memory controller 420 and either selected memory devices $412A_1$ and $412C_1$ or selected memory devices $412B_1$ and $412D_1$), and the second data transmission circuit $416_2$ is configurable to respond to module control signals by selectively allowing or inhibiting data transmission between the system memory controller 420 and either selected memory devices $412A_2$ and $412C_2$ or selected memory devices $412B_2$ and $412D_2$). Conversely, in a conventional memory module without the data transmission circuits 416, the two or more memory devices 412 (e.g., memory devices $412A_1$, $412B_1$, $412C_1$, $412D_1$) are concurrently operatively coupled to the system memory controller 420. A data transmission circuit 416 of certain embodiments bidirectionally buffer data signals between the memory controller 420 and the memory devices 412 corresponding to the data transmission circuit 416. For another example, as schematically shown in FIG. 3B, the first data transmission circuit $416'_1$ is configurable to respond to module control signals by selectively allowing or inhibiting data transmission between the system memory controller 420' and either selected memory devices $412'A_1$ and $412'C_1$ or selected memory devices $412'B_1$ and $412'D_1$ and either selected memory devices $412'A_2$ and $412'C_2$ or selected memory devices $412'B_2$ and $412'D_2$), and the second data transmission circuit $416'_2$ is configurable to respond to module control signals by selectively allowing or inhibiting data transmission between the system memory controller 420' and either selected memory devices $412'A_3$ and $412'C_3$ or selected memory devices $412'B_3$ and $412'D_3$ and either selected memory devices $412'A_4$ and $412'C_4$ or selected memory devices $412'B_4$ and $412'D_4$).

In certain embodiments, two or more of the data transmission circuits 416, 416' are mechanically coupled to the at least PCB 410, 410' at corresponding positions which are separate from one another. For example, as schematically illustrated by FIG. 3A, the first data transmission circuit $416_1$ and the second data transmission circuit $416_2$ are at corresponding positions which are separate from one another (e.g., the package containing the first data transmission circuit $416_1$ is at a location spaced from the location of the package containing the second data transmission circuit $416_2$). For another example, as schematically illustrated by FIG. 3B, the first data transmission circuit $416'_1$ and the second data transmission circuit $416'_2$ are at corresponding positions which are separate from one another (e.g., the package containing the first data transmission circuit $416'_1$ is at a location spaced from the location of the package containing the second data transmission circuit $416'_2$). In certain such embodiments, two or more of the data transmission circuits 416, 416' are distributed across a surface of the PCB 410, 410' of the memory module 402, 402'. In certain embodiments, the corresponding positions of two or more data transmission circuits 416, 416' (e.g., first data transmission circuit $416_1$ and second data transmission circuit $416_2$ of FIG. 3A or first data transmission circuit $416'_1$ and second data transmission circuit $416'_2$ of FIG. 3B) are along an edge 411, 411' of the at least one PCB 410, 410' such that a data transmission circuit 416, 416' is located substantially between the edge 411, 411' and at least some of the at least two memory devices 412, 412' to which the data transmission circuit 416, 416' is operatively coupled. For example, as schematically illustrated by FIG. 3A, the first data transmission circuit $416_1$ is located substantially between the edge 411 and the memory devices $412A_1$, $412B_1$, $412C_1$, $412D_1$ to which the first data transmission circuit $416_1$ is operatively coupled, and the second data transmission circuit $416_2$ is located substantially between the edge 411 and the memory devices $412A_2$, $412B_2$, $412C_2$, $412D_2$ to which the second data transmission circuit $416_1$ is operatively coupled. For another example, as schematically illustrated by FIG. 3B, the first data transmission circuit $416'_1$ is located substantially between the edge 411' and the memory devices $412'A_1$, $412'A_2$, $412'B_1$, $412'B_2$, $412'C_1$, $412'C_2$, $412'D_1$, $412'D_2$ to which the first data transmission circuit 416' is operatively coupled, and the second data transmission circuit $416'_2$ is located substantially between the edge 411' and the memory devices $412'A_3$, $412'A_4$, $412'B_3$, $412'B_4$, $412'C_3$, $412'C_4$, $412'D_3$, $412'D_4$ to which the second data transmission circuit $416'_2$ is operatively coupled.

FIGS. 3C and 3D illustrate the positioning of the data transmission circuits 416' in accordance with certain embodiments described herein. In certain embodiments, the position of at least one of the data transmission circuits 416' is generally aligned with one or more of the memory devices 412' to which the data transmission circuit 416' is operatively coupled. For example, the one or more of the data transmission circuits 416' and the memory devices 412' to which it is operatively coupled can be positioned generally along a line that is substantially perpendicular to the edge 411' of the PCB 410'. In certain embodiments, the position of at least one of the data transmission circuits 416' is generally offset from a line defined by the positions of the one or more of the memory devices 412' to which the data transmission circuit 416' is operatively coupled. For example, as shown in FIGS. 3C and 3D, the memory devices 412' operatively coupled to a data transmission circuit 416' can be positioned along a line that is substantially perpendicular to the edge 411' of the PCB 410' and the data transmission circuit 416' can be generally offset from this line in a direction generally along the edge 411' of the PCB 410'. In certain such embodiments, the data transmission circuits 416' are sufficiently small in width and breadth (e.g., 2.5 mm by 7.5 mm) to fit between the edge 411' and the corresponding memory devices 412' while maintaining the desired size of the memory module 400'. Other positions and sizes of the separate data transmission circuits 416' are also compatible with certain embodiments described herein. For example, in certain embodiments, one or more of the data transmission circuits 416, 416' can be positioned between two or more memory devices 412, 412', or can be spaced away from an edge 411, 411' of the PCB 410, 410' with one or more memory devices 412, 412' between the edge 411, 411' and the one or more data transmission circuits 416, 416'.

Figure 4A:
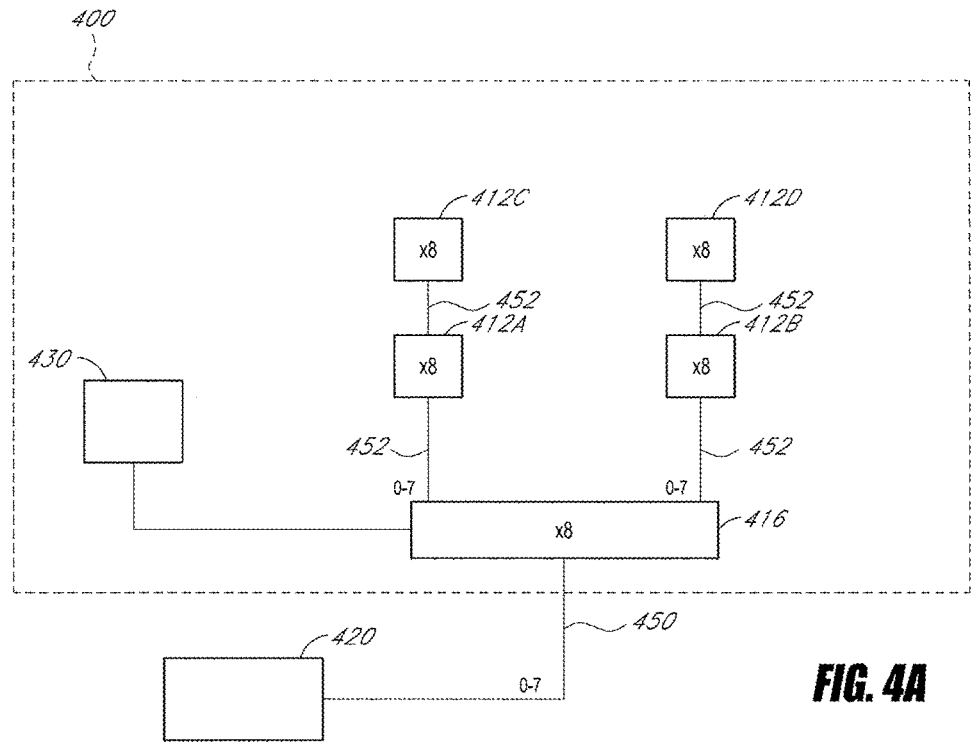
FIG. 4A schematically illustrates an example memory subsystem comprising a data transmission circuit with a bit width which is the same as that of the individual memory devices.

In certain embodiments, the data transmission circuit 416 comprises or functions as a byte-wise buffer. In certain such embodiments, each of the one or more data transmission circuits 416 has the same bit width as does the associated memory devices 412 per rank to which the data transmission circuit 416 is operatively coupled. For example, as schematically illustrated by FIG. 4A (which corresponds generally to FIG. 3A), the data transmission circuit 416 can be operatively coupled to a single memory device 412 per rank, and both the data transmission circuit 416 and the memory device 412 per rank to which the data transmission circuit 416 is operatively coupled can each have the same bit width (e.g., 4 bits, 8 bits, or 16 bits). The data transmission circuit 416 of FIG. 4A has a bit width of 8 bits, and receives data bits 0-7 from the system memory controller 420 and selectively transmits the data bits 0-7 to selected memory devices 412A, 412B, 412C, 412D in response to the module control signals from the control circuit 430. Similarly, data transmission circuits 416' of certain embodiments can function as a byte-wise buffer for associated memory devices 412'A, 412'B, 412'C, 412'D to which the data transmission circuits 416' are operatively coupled in response to the module control signals from the control circuit 430'.

Figure 4B:
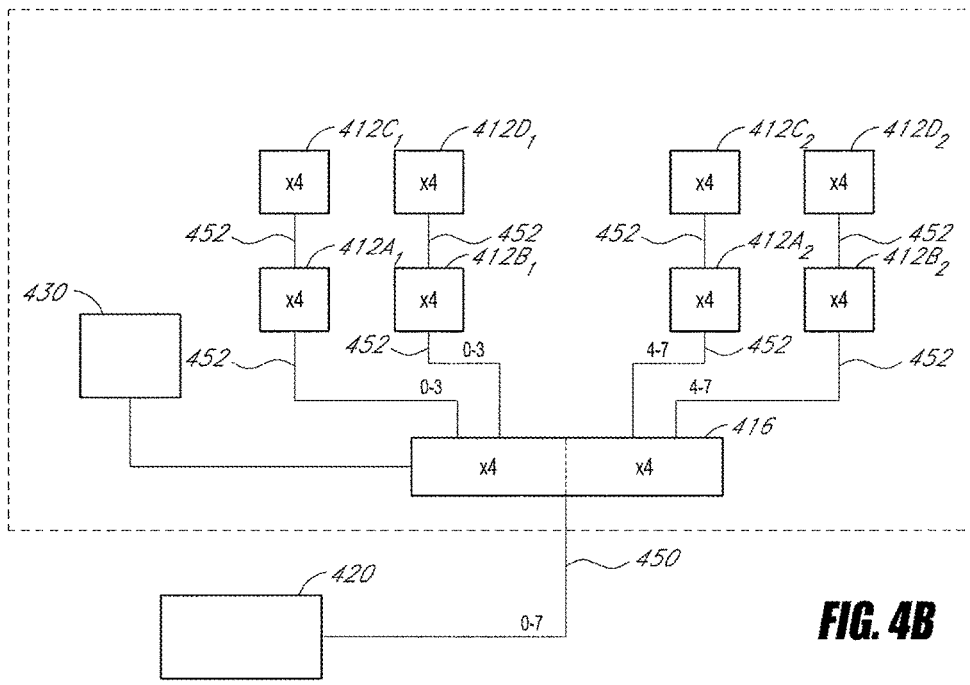
FIG. 4B schematically illustrates an example memory subsystem comprising a data transmission circuit with a bit width different from that as the individual memory devices.

In certain other embodiments, the bit widths of one or more of the memory devices 412 may be different from the bit widths of the one or more data transmission circuits 416 to which they are connected. For example, as schematically illustrated by FIG. 4B (which corresponds generally to FIG. 3B), the data transmission circuits 416 may have a first bit width (e.g., a bit width of 8 bits) and the memory devices 412 may have a second bit width which is less than the first bit width (e.g., one-half the first bit width, or a bit width of 4 bits), with each data transmission circuit 416 operatively coupled to multiple memory devices 412 per rank (e.g., two memory devices 412 in each rank). In certain such embodiments, the total bit width of the multiple memory devices 412 per rank connected to the circuit 416 equals the bit width of the circuit 416 (e.g., 4 bits, 8 bits, or 16 bits). The data transmission circuit 416 of FIG. 4B has a total bit width of 8 bits, and receives data bits 0-7 from the system memory controller 420 and selectively transmits data bits 0-3 to a first memory device 412A$_1$, 412B$_1$, 412C$_1$, 412D$_1$ and data bits 4-7 to a second memory device 412A$_2$, 412B$_2$, 412C$_2$, 412D$_2$ in response to the module control signals from the control circuit 430. Similarly, data transmission circuits 416' of certain embodiments can function with different bit widths than those of the associated memory devices 412'A$_1$, 412'A$_2$, 412'B$_1$, 412'B$_2$, 412'C$_1$, 412'C$_2$, 412'D$_1$, 412'D$_2$ to which the data transmission circuits 416' are operatively coupled in response to the module control signals from the control circuit 430'.

In certain embodiments, by having the data transmission circuit 416 comprise or serve as a "byte-wise" buffer (e.g., as shown in the examples of FIGS. 4A and 4B), the data signals are synchronous with the synch clock. In addition, for certain such embodiments in which the memory module 400 experiences variations in one or more characteristics (e.g., temperature, voltage, manufacturing parameters), the memory module 400 can be designed to optimize the circuits of a smaller number of components as compared to other configurations which do not utilize byte-wide buffering (e.g., having four ranks of 8-bit memory devices and having two 4-bit buffers). In certain embodiments, the data transmission circuits 416 are used for bit slicing in which the data are defined in sections. For example, rather than defining data to be 64-bit-wide (e.g., [63:0]), the data can be defined or sliced in 16-bit-wide sections (e.g., [15:0], [31:16], [47:32], [63:48]). In certain such embodiments, not all the bits are grouped together and not all the bits produce the same behavior (e.g., logic- and/or time-wise).

One or more of the data transmission circuits 416, in accordance with an embodiment of this disclosure, is operatively coupled to a corresponding one or more of the data lines 452 connected to one or more memory devices 412 in each of the ranks A, B, C, D. For example, in certain embodiments, each data transmission circuit 416 is connected to one or more data lines 452 connected to one corresponding memory device in each of the ranks (e.g., memory devices 204A, 204B, 204C, and 204D, as shown in FIG. 3A). Each data line 450, 452 thus carries data from the system memory controller 420, through the data transmission circuits 416, to the memory devices 204A, 204B, 204C, 204D connected to the data transmission circuits 416. The data transmission circuits 416 of certain embodiments may be used to drive each data bit to and from the memory controller 420 and the memory devices 412, instead of the memory controller 420 and the memory devices 412 directly driving each data bit to and from the memory controller 420 and the memory devices 412. Specifically, as described in more detail below, one side of each data transmission circuit 416 of certain embodiments is operatively coupled to a memory device 412 in each rank (e.g., via data lines 452), while the other side of the data transmission circuit 416 is operatively coupled to the corresponding data line 450 of the memory controller 420.

To reduce the memory device loads seen by the system memory controller 420 (e.g., during a write operation), the data transmission circuit 416 of certain embodiments is advantageously configured to be recognized by the system memory controller 420 as a single memory load. This advantageous result is desirably achieved in certain embodiments by using the data transmission circuits 416 to electrically couple only the enabled memory devices 412 to the memory controller 420 (e.g., the one, two, or more memory devices 412 to which data is to be written) and to electrically isolate the other memory devices 412 from the memory controller 420 (e.g., the one, two, or more memory devices 412 to which data is not to be written). Therefore, during a write operation in which data is to be written to a single memory device 412 in a rank of the memory module 400, each data bit from the system memory controller 420 sees a single load from the memory module 400, presented by one of the data transmission circuits 416, instead of concurrently seeing the loads of all of the four memory devices 412A, 412B, 412C, 412D to which the data transmission circuit 416 is operatively coupled. In the example of FIG. 3A, during a write operation in which data is to be written to two memory device 412 in two ranks (e.g., memory devices 412A and 412C or memory devices 412B and 412D), each data bit from the system memory controller 420 sees a single load from the memory module 402, which is presented by one of the data transmission circuits 416, instead of concurrently seeing the loads of all of the four memory devices 412A, 412B, 412C, 412D to which the data transmission circuits 416 is operatively coupled. In comparison to the standard JEDEC four-rank DIMM configuration (see FIG. 2A and FIG. 2B), the memory system 402 of certain embodiments may reduce the load on the system memory controller 420 by a factor of four.

Figure 5:
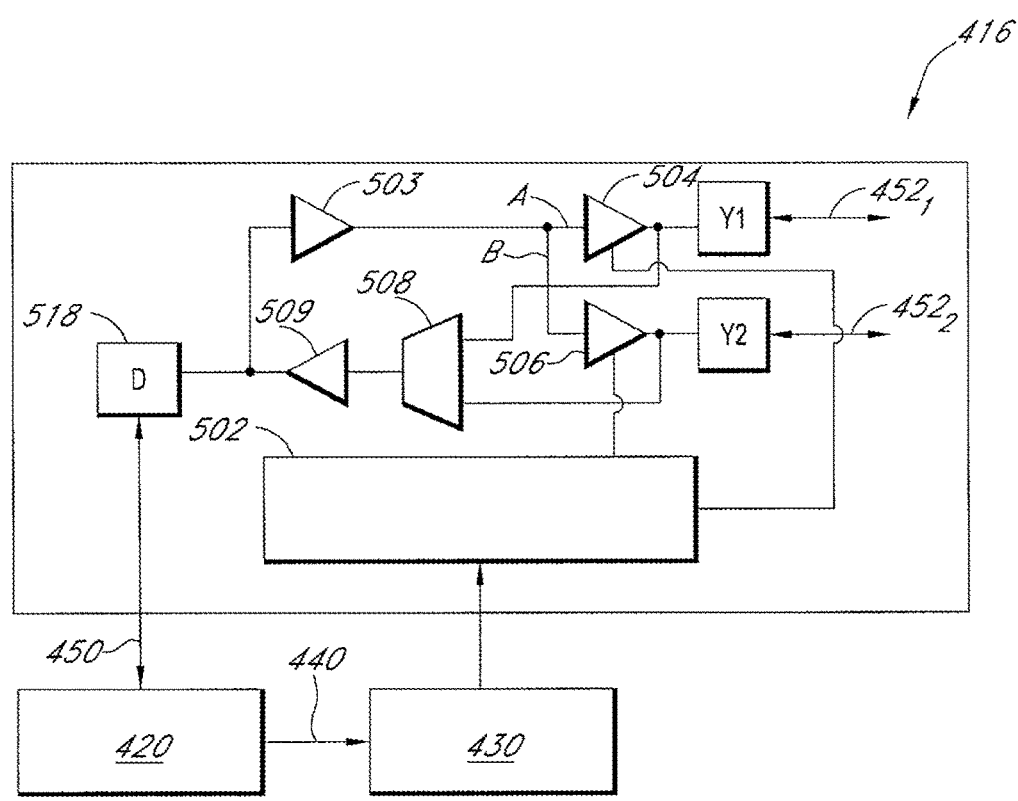
FIG. 5 is a schematic representation of an example embodiment of a data transmission circuit compatible with the memory subsystem of FIG. 3A.

FIG. 5 schematically illustrates an example data transmission circuit 416 compatible with certain embodiments described herein. In one embodiment, the data transmission circuits 416 includes control logic circuitry 502 used to control the various components of the data transmission circuit 416, which may include one or more buffers, one or more switches, and one or more multiplexers among other components. The illustrated embodiment of FIG. 5 is 1-bit wide and switches a single data line 518 between the memory controller 420 and the memory devices 412. In other embodiments, the data transmission circuit 416 may be multiple bits wide, for example, 8 bits, and switch a corresponding number of data lines 518. In a multiple bit wide embodiment, the control logic circuitry 502 may be shared over the multiple bits.

As a part of isolating the memory devices 412 from the system memory controller 420, in one embodiment, the data transmission circuits 416 allow for "driving" write data and "merging" read data. In the operational embodiment shown in FIG. 5, in a write operation, data entering a data transmission circuit 416 via a data line 518 is driven onto two data paths, labeled path A and path B, preferably after passing through a write buffer 503. The ranks of memory devices 412 are likewise divided into two groups with one group associated with path A and one group associated with path B. As shown in FIG. 3A, rank A and rank C are in the first group, and rank B and rank D are in the second group. Accordingly, the memory devices 412A, 412C of rank A and rank C are connected to the data transmission circuits 416 by a first one of the two data paths, and the memory devices 412B, 412D of rank B and rank D are connected to the data transmission circuits 416 by a second one of the two data paths. In other embodiments, the driving of write data and merging of read data may be performed over more than two data paths.

As is known, Column Address Strobe (CAS) latency is a delay time which elapses between the moment the memory controller 420 informs the memory modules 402 to access a particular column in a selected rank or row and the moment the data for or from the particular column is on the output pins of the selected rank or row. The latency may be used by the memory module to control operation of the data transmission circuits 416. During the latency, address and control signals pass from the memory controller 420 to the control circuit 430 which produces controls sent to the control logic circuitry 502 (e.g., via lines 432) which then controls operation of the components of the data transmission circuits 416.

For a write operation, during the CAS latency, the control circuit 430, in one embodiment, provides enable control signals to the control logic circuitry 502 of each data transmission circuit 416, whereby the control logic circuitry 502 selects either path A or path B to direct the data. Accordingly, when the control logic circuitry 502 receives, for example, an "enable A" signal, a first tristate buffer 504 in path A is enabled and actively drives the data value on its output, while a second tristate buffer 506 in path B is disabled with its output in a high impedance condition. In this state, the data transmission circuit 416 allows the data to be directed along path A to a first terminal Y1, which is connected to and communicates only with the first group of the memory devices 412, e.g., those in ranks A and C. Similarly, if an "enable B" signal is received, the first tristate 504 opens path A and the second tristate 506 closes path B, thus directing the data to a second terminal Y2, which is connected to and communicates only with the second group of the memory devices 412, e.g., those in ranks B and D.

For a read operation, the data transmission circuit 416 operates as a multiplexing circuit. In the illustrated embodiment of FIG. 5, for example, data signals read from the memory devices 412 of a rank are received at the first or second terminals Y1, Y2 of the data transmission circuit 416. The data signals are fed to a multiplexer 508, which selects one to route to its output. The control logic circuitry 502 generates a select signal to select the appropriate data signal, and the selected data signal is transmitted to the system memory controller 420 along a single data line 518, preferably after passing through a read buffer 509. The read buffer 509 may be a tristate buffer that is enabled by the control logic circuitry 502 during read operations. In another embodiment, the multiplexer 508 and the read buffer 509 may be combined in one component. In yet another embodiment, the multiplexer 508 and the read buffer 509 operations may be split over two tristate buffers, one to enable the value from Y1 to the data line 518 and another to enable the value from Y2 to the data line 518.

The data transmission circuits 416 present a load on the data lines 518 from the write buffer 503 and the read buffer 509. The write buffer 503 is comparable to an input buffer on one of the memory devices 412, and the read buffer 509 is comparable to an output buffer on one of the memory devices 412. Therefore, the data transmission circuits 416 present a load to the memory controller 420 that is substantially the same as the load that one of the memory devices 412 would present. Similarly, the data transmission circuits 416 present a load on the first and second terminals Y1, Y2 from the multiplexer 508 and the first tristate buffer 504 (on the first terminal Y1) and the second tristate buffer 506 (on the second terminal Y2). The multiplexer 508 is comparable in loading to an input buffer on the memory controller 420, and the first and second tristate buffers 504, 506 are each comparable to an output buffer on the memory controller 420. Therefore, the data transmission circuits 416 present a load to the memory devices 412 that is substantially the same as the load that the memory controller 420 would present.

Additionally, the data transmission circuits 416 operate to ameliorate quality of the data signals passing between the memory controller 420 and the memory devices 412. Without the data transmission circuits 416, waveforms of data signals may be substantially degraded or distorted from a desired shape between source and sink. For example, signal quality may be degraded by lossy transmission line characteristics, mismatch between characteristics of transmission line segments, signal crosstalk, or electrical noise. However, in the read direction, the read buffer 509 regenerates the signals from the memory devices 412 thereby restoring the desired signal waveform shapes. Similarly, in the write direction, the first tristate buffer 504 and the second tristate buffer 506 regenerate the signals from the memory controller 420 thereby restoring the desired signal waveform shapes.

Referring again to FIG. 3A, when the memory controller 420 executes read or write operations, each specific operation is targeted to a specific one of the ranks A, B, C, and D of a specific memory module 402. The data transmission circuit 416 on the specifically targeted one of the memory modules 402 functions as a bidirectional repeater/multiplexor, such that it drives the data signal when connecting from the system memory controller 420 to the memory devices 412. The other data transmission circuits 416 on the remaining memory modules 402 are disabled for the specific operation. For example, the data signal entering on data line 518 entering into data transmission circuit 416 is driven to memory devices 412A and 412C or 412B and 412C depending on which memory devices are active and enabled. The data transmission circuit 416 then multiplexes the signal from the memory devices 412A, 412B, 412C, 412D to the system memory controller 420. The data transmission circuits 416 may each control, for example, a nibble-wide data path or a byte-wide-data path. As discussed above, the data transmission circuits 416 associated with each module 402 are operable to merge data read signals and to drive data write signals, enabling the proper data paths between the system memory controller 420 and the targeted or selected memory devices 412. Thus, the memory controller 420, when there are four four-rank memory modules, sees four load-reducing switching circuit loads, instead of sixteen memory device loads. The reduced load on the memory controller 420 enhances the performance and reduces the power requirements of the memory system, as compared with, for example, the conventional systems described above with reference to FIGS. 1A, 1B and 2A-2D.

Figure 6:
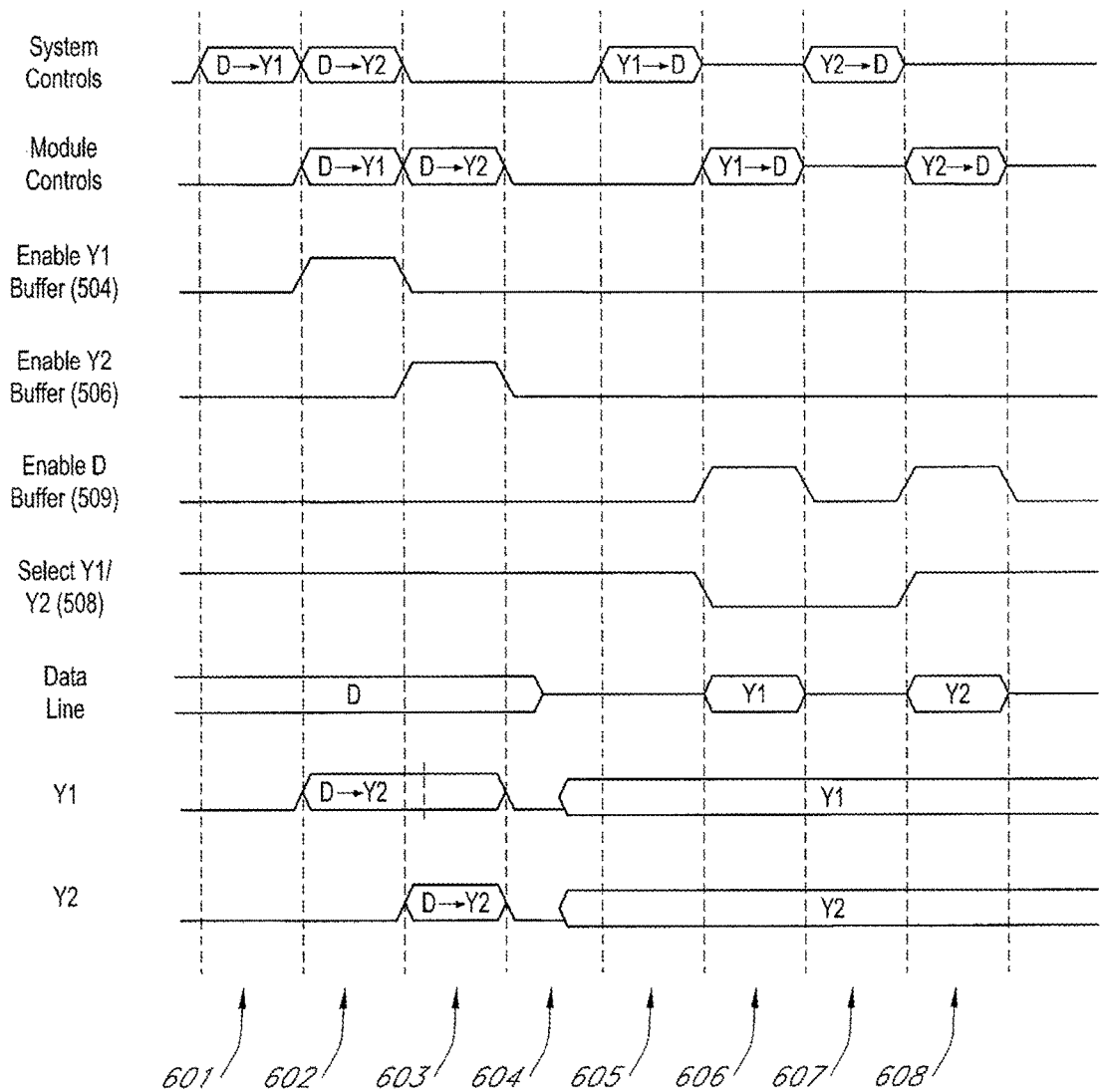
FIG. 6 is an example timing diagram illustrating operation of the memory system of FIGS. 3A and 5.

Operation of a memory module using the data transmission circuit 416 may be further understood with reference to FIG. 6, an illustrative timing diagram of signals of the memory module 402. The timing diagram includes first through eighth time periods 601-608. When the memory devices 404 are synchronous memories, each of the time periods 601-608 may correspond to one clock cycle of the memory devices 404.

The first, second, and third time periods 601-603 illustrate write operations with data passing from the memory controller 401 to the memory module 402. The fourth time period 604 is a transition between the write operations and subsequent read operations. The timing diagram shows a write operation to the first group of memory devices 412A, 412C connected to the first terminals Y1 of the data transmission circuits 416 and a write operation to the second group of memory devices 412B, 412D connected to the second terminals Y2 of the data transmission circuits 416. Recalling the CAS latency described above, each write operation extends over two time periods in a pipelined manner.

The write to the first group of memory devices 412A, 412C appears in the first time period 601 when system address and control signals 440 pass from the memory controller 420 to the module controller 430. The control circuit 430 evaluates the address and control signals 440 to determine that data is to be written to memory devices 412A, 412C in the first group. During the second time period 602, the control circuit 430 supplies control signals to the control logic circuitry 502 to enable the first tristate buffer 504 and to disable the second tristate buffer 506 and the read buffer 509. Thus, during the second time period 602, data bits pass from the data lines 518 to the first terminal Y1 and on to the memory devices 412A, 412C.

Similarly, the write to the second group of memory devices 412A, 412C appears in the second time period 602 when system address and control signals 440 pass from the memory controller 420 to the control circuit 430. The control circuit 430 evaluates the address and control signals 440 to determine that data is to be written to memory devices 412B, 412D in the second group. During the third time period 603, the control circuit 430 supplies control signals to the control logic circuitry 502 to enable the second tristate buffer 506 and to disable the first tristate buffer 504 and the read buffer 509. Thus, during the third time period 603, data bits pass from the data lines 518 to the second terminal Y2 and on to the memory devices 412B, 412D.

The fifth, sixth, seventh, and eighth time periods 605-608 illustrate read operations with data passing to the memory controller 420 from the memory module 402. The timing diagram shows a read operation from the first group of memory devices 412A, 412C connected to the first terminals Y1 of the data transmission circuits 416 and a read operation from the second group of memory devices 412B, 412D connected to the second terminals Y2 of the data transmission circuits 416. Recalling the CAS latency described above, each read operation extends over two time periods in a pipelined manner.

The read from the first group of memory devices 412A, 412C appears in the fifth time period 605 when system address and control signals 440 pass from the memory controller 420 to the control circuit 430. The control circuit 430 evaluates the address and control signals 440 to determine that data is to be read from memory devices 412A, 412C in the first group. During the sixth time period 606, the control circuit 430 supplies control signals to the control logic circuitry 502 to cause the multiplexer 58 to select data from the first terminal Y1, to enable the read buffer 509, and to disable the first tristate buffer 504 and the second tristate buffer 506. Thus, during the sixth time period 606, data bits pass from the memory devices 412A, 412C via the first terminal Y1 to data lines 518 and on to the memory controller 420.

The read from the second group of memory devices 412B, 412D appears in the seventh time period 607 when system address and control signals 440 pass from the memory controller 420 to the control circuit 430. The control circuit 430 evaluates the address and control signals 440 to determine that data is to be read from memory devices 412B, 412D in the second group. During the eighth time period 608, the control circuit 430 supplies control signals to the control logic circuitry 502 to cause the multiplexer 508 to select data from the second terminal Y2, to enable the read buffer 509, and to disable the first tristate buffer 504 and the second tristate buffer 506. Thus, during the eighth time period 606, data bits pass from the memory devices 412B, 412D via the second terminal Y2 to data lines 518 and on to the memory controller 420.

Various embodiments have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A memory module having a width of N bits and configured to communicate with a memory controller via a set of control signal lines and M sets of n data lines, where M is greater than one and N=M×n, comprising:
- a module control circuit configured to receive a set of input address and control signals corresponding to a memory read or write command from the memory controller via the set of control signal lines and to produce first module control signals and second module control signals in response to the set of input address and control signals;
- a plurality of memory devices coupled to the module control circuit, the plurality of memory devices including first memory devices and second memory devices, wherein, in response to the first module control signals, the first memory devices output or receive each N-bit wide data signal associated with the memory read or write command while the second memory devices do not output or receive any data associated with the memory read or write command;
- M buffer circuits each configured to receive the second module control signals from the module control circuit, each respective buffer circuit of the M buffer circuits being coupled to a respective set of the M sets of n data lines, to respective one or more of the first memory devices via a set of n module data lines, and to respective one or more of the second memory devices via the set of n module data lines, the each respective buffer circuit including logic that responds to the second module control signals by allowing communication of a respective n-bit section of the each N-bit wide data signal between the respective one or more of the first memory devices and the memory controller via the respective set of the M sets of n data lines and via the set of n module data lines, wherein the each respective buffer circuit is further configured to isolate memory device load associated with the respective one or more of the first memory devices as well as memory device load associated with the respective one or more of the second memory devices from the memory controller; and
- a printed circuit board (PCB) having an edge connector positioned on an edge of the PCB, the edge connector comprising a plurality of electrical contacts configured to be releasably coupled to corresponding contacts of a computer system socket to provide electrical conductivity between the module control circuit and the set of control signal lines, and between the M buffer circuits and the M sets of n data lines, wherein the M buffer circuits are mounted on the PCB between the plurality of memory devices and the edge connector and are distributed along the edge connector at corresponding positions separate from each other, and wherein the each respective buffer circuit is disposed on the PCB in a position corresponding to the respective one or more of the first memory devices and the respective one or more of the second memory devices.

2. The memory module of claim 1, wherein the set of input address and control signals include at least one first chip-select signal, wherein the first module control signals include second chip-select signals, and wherein the module control circuit is configured to generate the second chip-select signals based on the set of input address and control signals, the second chip-select signals having a larger number of chip select signals than the at least one first chip-select signal.

3. The memory module of claim 1, wherein the each respective buffer circuit is configured to present one memory device load on each of the respective set of the M sets of n data lines to the memory controller.

4. The memory module of claim 3, wherein the first module control signals include chip select signals, wherein the first memory devices and the second memory devices receive different chip select signals from the module control circuit.

5. The memory module of claim 1, wherein the each respective buffer circuit is configured to present a load to the respective one or more of the first memory devices that is the same as a load the memory controller would present.

6. The memory module of claim 1, wherein the each respective buffer circuit has a first data width of n bits, and wherein each of the plurality of memory devices has a second data width different from the first data width.

7. The memory module of claim 1, wherein the second module control signals indicate a direction of data flow through the buffer circuits.

8. The memory module of claim 1, wherein the module control circuit is further configured to control the timing of each N-bit wide data signal associated with the memory read or write command using the second module control signals in accordance with a latency parameter.

9. The memory module of claim 1, wherein the module control circuit comprises one or more integrated circuits having first input/output connections, second input/output connections, third input/output connections, and fourth input/output connections, wherein the first memory devices include a subset of memory devices coupled to the first input/output connections and another subset of memory devices coupled to the second input/output connections, and wherein the second memory devices include a subset of memory devices coupled to the third input/output connections and another subset of memory devices coupled to the fourth input/output connections.

10. The memory module of claim 1, wherein the first module control signals include chip select signals, wherein the first memory devices and the second memory devices receive different chip select signals from the module control circuit.

11. The memory module of claim 1, wherein the respective one or more of the first memory devices include a single memory device outputting or receiving the respective n-bit section of the each N-bit wide data signal associated with the memory read or write command.

12. The memory module of claim 1, wherein the respective one or more of the first memory devices include a pair of memory devices each outputting or receiving half of the respective n-bit section of the each N-bit wide data signal associated with the memory read or write command.

13. The memory module of claim 1, further comprising module signal lines including a set of module signal lines coupling respective input/output connections on the module control circuit to corresponding input/output connections on respective subsets of the plurality of memory devices.

14. The memory module of claim 1, wherein the first memory read or write command is a memory write command, and wherein the each respective buffer circuit includes tristate buffers controlled by the logic to transmit the respective n-bit section of the each N-bit wide data signal associated with the memory write command to the respective one or more of the first memory devices.

15. The memory module of claim 1, wherein the M buffer circuits are byte-wise buffer circuits, and wherein each set of the M sets of n data signal lines is eight bits wide.

16. A memory module having a width of N bits and configured to communicate with a memory controller via a set of control signal lines and M sets of n data lines, where M is greater than one and N=M×n, comprising:
- a control circuit configured to receive a set of input address and control signals corresponding to a memory read or write command from the memory controller via the set of control signal lines and to produce first module control signals and second module control signals in response to the set of input address and control signals;
- a plurality of memory devices coupled to the control circuit, the plurality of memory devices including first memory devices and second memory devices, wherein, in response to the first module control signals, the first memory devices output or receive each N-bit wide data signal associated with the memory read or write command while the second memory devices do not output or receive any data associated with the memory read or write command;
- a plurality of buffer circuits configured to receive the second module control signals from the control circuit, each respective buffer circuit being operatively coupled to the memory controller via a respective set of the M sets of n data lines, to respective one or more of the first memory devices via a set of n module data lines, and to respective one or more of the second memory devices via the set of n module data lines, the each respective buffer circuit including data paths and logic that configures the data paths in response to the second module control signals, causing a respective n-bit section of the each N-bit wide data signal to be communicated between the respective set of the M sets of n data lines and the set of n module data lines through the respective buffer circuits, wherein the each respective buffer circuit is further configured to isolate memory device load associated with the respective one or more of the first memory devices as well as memory device load associated with the respective one or more of the second memory devices from the memory controller; and
- a printed circuit board (PCB) having an edge connector positioned on an edge of the PCB, the edge connector comprising a plurality of electrical contacts configured to be releasably coupled to corresponding contacts of a computer system socket to provide electrical conductivity between the control circuit and the set of control signal lines, and between the plurality of buffer circuits and the M sets of n data lines, wherein the plurality of buffer circuits are mounted on the PCB between the plurality of memory devices and the edge connector and are distributed along the edge connector at corresponding positions separate from each other, and wherein the each respective buffer circuit is disposed on the PCB in a position corresponding to the respective one or more of the first memory devices and the respective one or more of the second memory devices.

17. The memory module of claim 16, wherein the data paths include write data paths, each write data path including at least one tristate buffer controlled by the logic.

18. The memory module of claim 17, wherein the data paths further include read data paths, each read data path including a tristate buffer controlled by the logic.

19. The memory module of claim 18, wherein the second module control signals indicate a direction of data flow through the buffer circuits.

20. The set of circuits in claim 18, wherein the control circuit is further configured to control the timing of each N-bit wide data signal associated with the memory read or write command using the module control signals in accordance with a latency parameter.

21. The memory module of claim 18, wherein the first module control signals include chip select signals, wherein the first memory devices and the second memory devices receive different chip select signals from the control circuit.

22. The memory module of claim 18, wherein the set of input address and control signals include at least one first chip-select signal, wherein the first module control signals include second chip-select signals, and wherein the control circuit is configured to generate the second chip-select signals based on the set of input address and control signals, the second chip-select signals having a larger number of chip select signals than the at least one first chip-select signal.

23. The memory module of claim 18, further comprising module signal lines including a set of module signal lines coupling respective input/output connections on the module control circuit to corresponding input/output connections on respective subsets of the plurality of memory devices.

24. The memory module of claim 16, wherein the second module control signals indicate a direction of data flow through the buffer circuits.

25. The memory module of claim 16, wherein the control circuit is further configured to control the timing of each N-bit wide data signal associated with the memory read or write command using the second module control signals in accordance with a latency parameter.

26. The memory module of claim 16, wherein each of the plurality of memory devices is n-bit wide, wherein the respective one or more of the first memory devices include a single memory device outputting or receiving the respective n-bit section of the each N-bit wide data signal associated with the memory read or write command.

27. The memory module of claim 16, wherein each of the memory devices is n/2-bit wide, wherein the respective one or more of the first memory devices include a pair of memory devices each outputting or receiving half of the respective n-bit section of the each N-bit wide data signal associated with the memory read or write command.

28. The memory module of claim 16, wherein the control circuit comprises one or more integrated circuits having first input/output connections, second input/output connections, third input/output connections, and fourth input/output connections, wherein the first memory devices include a subset of memory devices coupled to the first input/output connections and another subset of memory devices coupled to the second input/output connections, and wherein the second memory devices include a subset of memory devices coupled to the third input/output connections and another subset of memory devices coupled to the fourth input/output connections.

29. The memory module of claim 16, wherein the plurality of buffer circuits are byte-wise buffer circuits, and wherein each set of the M sets of n data signal lines is eight bits wide.

30. A memory module having a data width of N bits and configured to communicate with a memory controller via a set of control signal lines and a plurality of sets of data signal lines, comprising:
- a module control circuit configured to receive from the memory controller via the set of control signal lines first input address and control signals corresponding to a first write command and subsequently second input address and control signals corresponding to a second write command, the module control circuit producing first output address and control signals and first module control signals in response to the first input address and control signals, the module control circuit producing second output address and control signals and second module control signals in response to the second input address and control signals, the second module control signals being different from the first module control signals;

memory devices coupled to the module control circuit, the memory devices including first memory devices responding to the first output address and control signals by receiving each N-bit wide data signal associated with the first write command, and second memory devices responding to the second output address and control signals by receiving each N-bit wide data signal associated with the second write command; and a plurality of buffer circuits operatively coupled to respective sets of the plurality of sets of data signal lines and configured to receive the first module control signals from the module control circuit and subsequently the second module control signals from the module control circuit, each respective buffer circuit in the plurality of buffer circuits including data paths and logic that configures the data paths in response to the first module control signals, causing a respective n-bit section of the each N-bit wide data signal associated with the first write command received by the each respective buffer circuit from the memory controller via a respective set of the plurality of sets of data signal lines, to be transmitted by the each respective buffer circuit to respective one or more of the first memory devices, where n is equal to a bit width of the each respective buffer circuit, wherein the logic in the each respective buffer circuit subsequently configures the data paths in response to the second module control signals, causing a respective n-bit section of the each N-bit wide data signal associated with the second write command received by the each respective buffer circuit from the memory controller via the respective set of the plurality of sets of data signal lines, to be transmitted by the each respective buffer circuit to respective one or more of the second memory devices, the data paths being configured differently when the logic is responding to the second module control signals from when the logic is responding to the first module control signals, wherein each of the respective one or more of the first memory devices receives at least a portion of the respective n-bit section of the each N-bit wide data signal associated with the first write command, and wherein each of the respective one or more of the second memory devices receives at least a portion of the respective n-bit section of the each N-bit wide data signal associated with the second write command; and a printed circuit board (PCB) having an edge connector positioned on an edge of the PCB, the edge connector comprising a plurality of electrical contacts configured to be releasably coupled to corresponding contacts of a computer system socket to provide electrical conductivity between the module control circuit and the set of control signal lines, and between the plurality of buffer circuits and the plurality sets of data signal lines, wherein the plurality of buffer circuits are mounted on the PCB between memory devices and the edge connector and are distributed along the edge connector at corresponding positions separate from each other, and wherein the each respective buffer circuit is disposed on the PCB in a position corresponding to the respective one or more of the first memory devices and the respective one or more of the second memory devices.

31. The memory module of claim 30, wherein the data paths in the each respective buffer circuit are configured in accordance with a latency parameter when the logic is responding to the first module control signals and when the logic is responding to the second module control signals.

32. The memory module of claim 30, wherein the each respective buffer circuit is further configured to isolate memory device load associated with the respective one or more of the first memory devices and memory device load associated with the respective one or more of the second memory devices from the memory controller.

33. The memory module of claim 32, wherein the each respective buffer circuit is configured to present to the memory controller one memory device load on each data signal line of the respective set of the plurality of sets of data signal lines.

34. The memory module of claim 32, wherein the each respective buffer circuit is configured to present a load that is the same as a load the memory controller would present to the respective one or more of the first memory devices and subsequently to the respective one or more of the second memory devices.

35. The memory module of claim 30, wherein the plurality of buffer circuits are byte-wise buffer circuits, and wherein each set of the plurality of sets of data signal lines is eight bits wide.

36. The memory module of claim 30, wherein the module control circuit comprises one or more integrated circuits having first input/output connections, second input/output connections, third input/output connections, and fourth input/output connections, wherein the first memory devices include a subset of memory devices coupled to the first input/output connections and another subset of memory devices coupled to the second input/output connections, and wherein the second memory devices include a subset of memory devices coupled to the third input/output connections and another subset of memory devices coupled to the fourth input/output connections.

37. The memory module of claim 30, wherein each of the memory devices is n-bit wide, wherein the respective one or more of the first memory devices include a single memory device receiving the respective n-bit section of the each N-bit wide data signal associated with the first write command, and wherein the respective one or more of the second memory devices include a single memory device receiving the respective n-bit section of the each N-bit wide data signal associated with the second write command.

38. The memory module of claim 30, wherein each of the memory devices is n/2-bit wide, wherein the respective one or more of the first memory devices include a pair of memory devices each receiving half of the respective n-bit section of the each N-bit wide data signal associated with the first write command, and wherein the respective one or more of the second memory devices include a pair of memory devices each receiving half of the respective n-bit section of the each N-bit wide data signal associated with the second write command.

39. The memory module of claim 30, wherein the each respective buffer circuit includes input buffers to receive the respective n-bit section of the each N-bit wide data signal associated with the first write command from the memory controller, wherein each of the input buffers is comparable in loading to an input buffer on one of the memory devices.

40. The memory module of claim 39, wherein the each respective buffer circuit further includes output buffers to drive the respective n-bit section of the each N-bit wide data signal associated with the first write command to the respective one or more of the first memory devices, wherein each of the output buffers is comparable in loading to an output buffer on the memory controller.

41. The memory module of claim 40, wherein the output buffers regenerate the respective n-bit section of the each N-bit wide data signal associated with the first write command to restore desired signal waveform shapes in the respective n-bit section of the each N-bit wide data signal associated with the first write command.

42. The memory module of claim 39, wherein the plurality of buffer circuits are byte-wise buffer circuits, and wherein each set of the plurality of sets of data signal lines is eight bits wide.

43. A memory module configured to communicate with a memory controller via a set of control signal lines and a plurality of sets of data lines, comprising:
memory devices;
a module control circuit coupled to the set of control signal lines and configured to receive from the memory controller a set of input address and control signals corresponding to a memory read or write command via the set of control signal lines, and to produce output address and control signals in response to the set of input address and control signals, wherein the module control circuit is further configured to evaluate the set of input address and control signals to determine a subset of the memory devices to output or receive data associated with the memory read or write command, and to produce a set of module control signals dependent on which of the memory devices are determined to be the subset of the memory devices, and wherein, in response to the output address and control signals, the subset of the memory devices output or receive the data associated with the memory read or write command while other memory devices not in the subset of the memory devices do not output or receive any data associated with the memory read or write command;
a plurality of buffer circuits each configured to receive the set of module control signals from the module control circuit, wherein each respective buffer circuit of the plurality of buffer circuits is coupled between a respective set of the plurality of sets of data lines and respective module data lines that are coupled to respective one or more memory devices in the subset of the memory devices and to one or more of the other memory devices, the each respective buffer circuit including data paths and logic that configures the data paths in response to the set of module control signals to allow a respective portion of the data associated with the memory read or write command to be communicated between the memory controller and the respective one or more memory devices in the subset of the memory devices through the each respective buffer circuit, wherein the each respective buffer circuit is further configured to isolate memory device load associated with the respective one or more memory devices in the subset of the memory devices and memory device load associated with the one or more of the other memory devices from the memory controller; and
a printed circuit board (PCB) having an edge connector positioned on an edge of the PCB, the edge connector comprising a plurality of electrical contacts configured to be releasably coupled to corresponding contacts of a computer system socket to provide electrical conductivity between the module control circuit and the set of control signal lines, and between the plurality of buffer circuits and the plurality of sets of data lines, wherein the plurality of buffer circuits are mounted on the PCB between the memory devices and the edge connector and are distributed along the edge connector at corresponding positions separate from each other, and wherein the each respective buffer circuit is disposed on the PCB in a position corresponding to the respective one or more memory devices in the subset of the memory devices and the one or more of the other memory devices.

44. The memory module of claim 43, wherein the set of module control signals are further dependent on whether the memory read or write command is a memory read command or a memory write command, and wherein the logic configures the data paths differently depending on whether the memory read or write command is a memory read command or a memory write command.

45. The memory module of claim 43, wherein the data paths include write data paths, and wherein the write data paths include tristate buffers controlled by the logic.

46. The memory module of claim 45, wherein the memory read or write command is a memory write command, and wherein the tn state buffers regenerate signals carrying the respective portion of the data associated with the memory read or write command received from the memory controller to restore signal waveform shapes, and transmit regenerated signals to the respective one or more of the subset of the memory devices.

47. The memory module of claim 45, wherein the each respective buffer circuit is configured to present one memory device load on each data line of the respective set of the plurality of sets of data lines to the memory controller.

48. The memory module of claim 45, wherein the data paths include read data paths, and wherein the read data paths include tristate buffers controlled by the logic.

49. The memory module of claim 48, wherein the memory read or write command is a memory read command, and wherein the tn state buffers in the read data paths regenerate signals carrying the respective portion of the data associated with the memory read or write command received from the respective one or more of the subset of the memory devices to restore signal waveform shapes, and transmit regenerated signals to the memory controller via the respective set of the plurality sets of data lines.

50. The memory module of claim 48, wherein each of the plurality of buffer circuits is a byte-wise buffer circuit, and wherein each set of the plurality of sets of data lines is eight bits wide.

51. The memory module of claim 50, wherein each of the memory devices is eight bits wide, wherein the one or more memory devices in the subset of the memory devices include a single memory device outputting or receiving the respective portion of the data associated with the memory read or write command.

52. The memory module of claim 50, wherein each of the memory devices is four bits wide, wherein the one or more memory devices in the subset of the memory devices include a pair of memory devices each outputting or receiving half of the respective portion of the data associated with the memory read or write command.

53. A memory module configured to communicate with a memory controller via a set of control signal lines and a plurality of sets of data signal lines, comprising:

a module control circuit coupled to the set of control signal lines and configured to receive a set of input address and control signals corresponding to a memory read or write command from the memory controller via the set of control signal lines and to produce output address and control signals and a set of module control signals in response to the input address and control signals, the module control circuit having first input/output connections, second input/output connections, third input/output connections, and fourth input/output connections;

memory devices including first memory devices and second memory devices, the first memory devices including a first number of memory devices coupled to the first input/output connections and a second number of memory devices coupled to the second input/output connections, the second memory devices including a third number of memory devices coupled to the third input/output connections and a fourth number of memory devices coupled to the fourth input/output connections, wherein, in response to the output address and control signals, the first memory devices output or receive each N-bit wide data signal associated with the memory read or write command while the second memory devices do not output or receive any data associated with the memory read or write command;

a plurality of buffer circuits each configured to receive the set of module control signals from the module control circuit, wherein each respective buffer circuit is coupled between respective one or more of the first memory devices and a respective set of the plurality of sets of data lines, and between respective one or more of the second memory devices and the respective set of the plurality of sets of data lines, the each respective buffer circuit including data paths and logic that configures the data paths in response to the set of module control signals to allow a respective section of the each N-bit wide data signal to be communicated between the memory controller and the respective one or more of the first memory devices through the each respective buffer circuit, wherein the data paths include write data paths and read data paths, the write data paths including tristate buffers controlled by the logic and the read data paths including tristate buffers controlled by the logic, wherein the each respective buffer circuit is further configured to isolate memory device load associated with the respective one or more of the first memory devices and the respective one or more of the second memory devices from the memory controller; and a printed circuit board (PCB) having an edge connector positioned on an edge of the PCB, the edge connector comprising a plurality of electrical contacts configured to be releasably coupled to corresponding contacts of a computer system socket to provide electrical conductivity between the module control circuit and the set of control signal lines, and between the plurality of buffer circuits and the plurality of sets of data signal lines, wherein the plurality of buffer circuits are mounted on the PCB between the memory devices and the edge connector and are distributed along the edge connector at corresponding positions separate from each other, and wherein the each respective buffer circuit is disposed on the PCB in a position corresponding to the respective one or more of the first memory devices and the respective one or more of the second memory devices.

54. The memory module of claim 53, wherein the each respective buffer circuit is configured to present one memory device load on each of the respective set of the plurality of sets of data lines to the memory controller.

55. The memory module of claim 54, wherein each of the plurality of buffer circuits is a byte-wise buffer circuit, and wherein each set of the plurality of sets of data lines is eight bits wide.

56. The memory module of claim 55, wherein each of the memory devices is eight bits wide, wherein the one or more of the first memory devices include a single memory device outputting or receiving the respective 8-bit section of each N-bit wide data signal associated with the memory read or write command.

57. The memory module of claim 55, wherein each of the memory devices is four bits wide, wherein the one or more of the first memory devices include a pair of memory devices each outputting or receiving 4 bits of the respective 8-bit section of each N-bit wide data signal associated with the memory read or write command.

58. A memory module configured to communicate with a memory controller via a set of control signal lines and a plurality of sets of data lines, comprising:

memory devices including first memory devices and second memory devices;

a module control circuit coupled to the set of address and control signal lines and configured to receive from the memory controller via the set of control signal lines a first set of input address and control signals corresponding to a first memory read or write command and subsequently a second set of input address and control signals corresponding to a second memory read or write command, and to produce first output address and control signals in response to the first set of input address and control signals and second output address and control signals in response to the second set of input address and control signals, wherein, in response to the first output address and control signals, the first memory devices output or receive data associated with the first memory read or write command while the second memory devices do not output or receive any data associated with the first memory read or write command, wherein, in response to the second output address and control signals, the second memory devices output or receive data associated with the second memory read or write command while the first memory devices do not output or receive any data associated with the second memory read or write command, and wherein the module control circuit is further configured to produce a first set of module control signals in response to the first set of input address and control signals and a second set of module control signals in response to the second set of input address and control signals, the second set of module control signals being different from the first set of module control signals;

a plurality of buffer circuits each configured to receive from the module control circuit the first set of module control signals and subsequently the second set of module control signals, wherein each respective buffer circuit of the plurality of buffer circuits is coupled between a respective set of the plurality of sets of data lines and respective one or more of the first memory devices, and between the respective set of the plurality of sets of data lines and respective one or more of the second memory devices, the each respective buffer circuit including data paths and logic that configures the data paths in response to the first set of module control signals to allow a respective portion of the data associated with the first memory read or write command to be communicated between the memory controller and the respective one or more of the first memory devices through the each respective buffer circuit, wherein the logic subsequently configures the data paths in response to the second set of module control signals to allow a respective portion of the data associated with the second memory read or write command to be communicated between the memory controller and the respective one or more of the second memory devices through the each respective buffer circuit, the data paths being configured differently when the logic is responding to the second module control signals from when the logic is responding to the first module control signals, wherein the each respective buffer circuit is further configured to isolate memory device load associated with the respective one or more of the first memory devices and memory device load associated with the one or more of the second memory devices from the memory controller; and a printed circuit board (PCB) having an edge connector positioned on an edge of the PCB, the edge connector comprising a plurality of electrical contacts configured to be releasably coupled to corresponding contacts of a computer system socket to provide electrical conductivity between the module control circuit and the set of control signal lines, and between the plurality of buffer circuits and the plurality of sets of data lines, wherein the plurality of buffer circuits are mounted on the PCB between the memory devices and the edge connector and are distributed along the edge connector at corresponding positions separate from each other, and wherein the each respective buffer circuit is disposed on the PCB in a position corresponding to the respective one or more of the first memory devices and the respective one or more of the second memory devices.

59. The memory module of claim 58, further comprising module signal lines including a set of module signal lines coupling respective input/output connections on the module control circuit to corresponding input/output connections on respective subsets of the memory devices.

60. The memory module of claim 59, wherein the data paths include write data paths, and wherein the write data paths include tristate buffers controlled by the logic.

61. The memory module of claim 60, wherein the each respective buffer circuit is configured to present one memory device load on each data line of the respective set of the plurality of sets of data lines.

62. The memory module of claim 60, wherein the data paths include read data paths, and wherein the read data paths including tristate buffers controlled by the logic.

63. The memory module of claim 62, wherein each of the plurality of buffer circuits is a byte-wise buffer circuit, and wherein each set of the plurality of sets of data lines is eight bits wide.

64. The memory module of claim 63, wherein each of the memory devices is eight bits wide, wherein the respective one or more of the first memory devices include a single memory device outputting or receiving the respective portion of the data associated with the first memory read or write command.

65. The memory module of claim 63, wherein each of the memory devices is four bits wide, wherein the respective one or more of the first memory devices include a pair of memory devices each outputting or receiving half of the respective portion of the data associated with the first memory read or write command.

* * * * *

(12) INTER PARTES REVIEW CERTIFICATE (2267th)
United States Patent (10) Number: US 9,606,907 K1
Lee et al. (45) Certificate Issued: Aug. 17, 2021

(54) MEMORY MODULE WITH DISTRIBUTED DATA BUFFERS AND METHOD OF OPERATION

(71) Applicant: Netlist, Inc.

(72) Inventors: Hyun Lee; Jayesh R. Bhakta

(73) Assignee: Netlist, Inc.

Trial Numbers:

IPR2018-00362 filed Dec. 22, 2017
IPR2018-00363 filed Dec. 22, 2017

Inter Partes Review Certificate for:

Patent No.: 9,606,907
Issued: Mar. 28, 2017
Appl. No.: 13/970,606
Filed: Aug. 20, 2013

The results of IPR2018-00362 consolidated with IPR2018-00363 are reflected in this inter partes review certificate under 35 U.S.C. 318(b).

INTER PARTES REVIEW CERTIFICATE
U.S. Patent 9,606,907 K1
Trial No. IPR2018-00362
Certificate Issued Aug. 17, 2021

AS A RESULT OF THE INTER PARTES REVIEW PROCEEDING, IT HAS BEEN DETERMINED THAT:

Claims 1-65 are cancelled.

\* \* \* \* \*